(12) United States Patent
Khlat

(10) Patent No.: US 12,401,332 B2
(45) Date of Patent: Aug. 26, 2025

(54) PHASE AND AMPLITUDE ERROR CORRECTION IN A TRANSMISSION CIRCUIT

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

(*) Notice: Subject to any disclaimer, the term of this patent is extended or adjusted under 35 U.S.C. 154(b) by 312 days.

(21) Appl. No.: 17/939,372

(22) Filed: Sep. 7, 2022

(65) Prior Publication Data

US 2023/0082415 A1 Mar. 16, 2023

Related U.S. Application Data

(60) Provisional application No. 63/245,151, filed on Sep. 16, 2021, provisional application No. 63/245,160, filed on Sep. 16, 2021.

(51) Int. Cl.
*H03F 3/24* (2006.01)
*H03F 1/02* (2006.01)
(Continued)

(52) U.S. Cl.
CPC .......... *H03F 3/245* (2013.01); *H03F 1/0222* (2013.01); *H03F 1/3288* (2013.01); *H03F 3/195* (2013.01);
(Continued)

(58) Field of Classification Search
CPC ...... H03F 3/245; H03F 1/0222; H03F 1/3288; H03F 3/195; H03F 2200/451;
(Continued)

(56) References Cited

U.S. PATENT DOCUMENTS 4,797,898 A 1/1989 Martinez
5,793,821 A 8/1998 Norrell et al.
(Continued)

FOREIGN PATENT DOCUMENTS

BR 112015001348 A2 7/2017
CN 1151229 A 6/1997
(Continued)

OTHER PUBLICATIONS

Paek, J.-S et al., "Design of Boosted Supply Modulator With Reverse Current Protection for Wide Battery Range in Envelope Tracking Operation," IEEE Transactions on Microwave Theory and Techniques, vol. 67, No. 1, Jan. 2019, pp. 183-194.
(Continued)

*Primary Examiner* — Yuwen Pan
*Assistant Examiner* — Swati Jain
(74) *Attorney, Agent, or Firm* — Withrow & Terranova, P.L.L.C.

(57) ABSTRACT

Phase and amplitude error correction in a transmission circuit is provided. The transmission circuit includes a transceiver circuit, a power management integrated circuit (PMIC), and a power amplifier circuit(s). The transceiver circuit generates a radio frequency (RF) signal(s) from an input vector, the PMIC generates a modulated voltage, and the power amplifier circuit(s) amplifies the RF signal(s) based on the modulated voltage. When the power amplifier circuit(s) is coupled to an RF front-end circuit, unwanted amplitude-amplitude (AM-AM) and amplitude-phase (AM-PM) errors may be created across a modulation bandwidth of the transmission circuit. In this regard, in embodiments disclosed herein, the input vector is equalized based on multiple complex filters to thereby cause the AM-AM and AM-PM errors to be corrected in the transmission circuit. As a result, it is possible to reduce undesired instantaneous
(Continued)

excessive compression and/or spectrum regrowth across the modulation bandwidth of the transmission circuit.

20 Claims, 12 Drawing Sheets

(51) Int. Cl.
  *H03F 1/32* (2006.01)
  *H03F 3/195* (2006.01)
  *H04B 1/04* (2006.01)
(52) U.S. Cl.
  CPC ..... *H04B 1/0475* (2013.01); *H03F 2200/451* (2013.01); *H03F 2201/3233* (2013.01); *H04B 2001/0425* (2013.01)
(58) Field of Classification Search
  CPC . H03F 2201/3233; H03F 3/19; H04B 1/0475; H04B 2001/0425
  See application file for complete search history.

(56) References Cited

U.S. PATENT DOCUMENTS

| | | | |
|---|---|---|---|
| 6,166,601 A | 12/2000 | Shalom et al. | |
| 6,275,685 B1 | 8/2001 | Wessel et al. | |
| 6,630,862 B1 | 10/2003 | Perthold et al. | |
| 6,760,451 B1 | 7/2004 | Craven et al. | |
| 6,806,767 B2 | 10/2004 | Dow | |
| 6,947,711 B1 | 9/2005 | Leyonhjelm | |
| 7,076,225 B2 | 7/2006 | Li et al. | |
| 7,170,342 B2 | 1/2007 | Suzuki et al. | |
| 7,430,248 B2 | 9/2008 | McCallister | |
| 7,583,754 B2 | 9/2009 | Liu | |
| 7,663,436 B2 | 2/2010 | Takano et al. | |
| 7,683,713 B2 | 3/2010 | Hongo | |
| 7,755,429 B2 | 7/2010 | Nguyen et al. | |
| 7,859,338 B2 | 12/2010 | Bajdechi et al. | |
| 7,889,820 B2 | 2/2011 | Murthy et al. | |
| 7,978,009 B2 | 7/2011 | Mu | |
| 8,493,141 B2 | 7/2013 | Khlat et al. | |
| 8,605,819 B2 | 12/2013 | Lozhkin | |
| 8,649,745 B2 | 2/2014 | Bai et al. | |
| 8,749,309 B2 | 6/2014 | Ho et al. | |
| 8,831,544 B2 | 9/2014 | Walker et al. | |
| 8,884,692 B2 | 11/2014 | Lee | |
| 9,001,947 B2 | 4/2015 | Wyville | |
| 9,036,734 B1 | 5/2015 | Mauer et al. | |
| 9,065,504 B2 | 6/2015 | Kwon et al. | |
| 9,112,413 B2 | 8/2015 | Barth et al. | |
| 9,356,760 B2 | 5/2016 | Larsson et al. | |
| 9,438,196 B2 | 9/2016 | Smith et al. | |
| 9,560,595 B2 | 1/2017 | Dakshinamurthy et al. | |
| 9,692,366 B2 | 6/2017 | Pilgram | |
| 9,705,477 B2 | 7/2017 | Velazquez | |
| 9,973,370 B1 | 5/2018 | Langer et al. | |
| 10,177,719 B2 | 1/2019 | Gazneli et al. | |
| 10,305,435 B1 | 5/2019 | Murugesu et al. | |
| 10,326,408 B2 | 6/2019 | Khlat et al. | |
| 10,361,744 B1 | 7/2019 | Khlat | |
| 10,432,145 B2* | 10/2019 | Khlat | H03F 1/0227 |
| 10,476,437 B2 | 11/2019 | Nag et al. | |
| 10,778,345 B2 | 9/2020 | El-Hassan et al. | |
| 11,005,368 B2 | 5/2021 | Bansal et al. | |
| 11,088,660 B2 | 8/2021 | Lin et al. | |
| 11,387,789 B2 | 7/2022 | Khlat et al. | |
| 11,424,719 B2 | 8/2022 | Khlat | |
| 11,483,186 B2 | 10/2022 | Casper et al. | |
| 11,569,783 B2 | 1/2023 | Nomiyama et al. | |
| 11,637,531 B1 | 4/2023 | Perreault et al. | |
| 2001/0022532 A1 | 9/2001 | Dolman | |
| 2001/0054974 A1 | 12/2001 | Wright | |
| 2002/0190811 A1 | 12/2002 | Sperber | |
| 2003/0042979 A1 | 3/2003 | Gurvich et al. | |
| 2004/0239446 A1 | 12/2004 | Gurvich et al. | |
| 2005/0100105 A1 | 5/2005 | Jensen | |
| 2005/0254659 A1 | 11/2005 | Heinsen | |
| 2006/0068710 A1* | 3/2006 | Jensen | H04L 25/03343 455/63.1 |
| 2006/0209981 A1 | 9/2006 | Kluesing et al. | |
| 2006/0217083 A1 | 9/2006 | Braithwaite | |
| 2007/0032208 A1 | 2/2007 | Choi et al. | |
| 2008/0009258 A1 | 1/2008 | Safarian et al. | |
| 2008/0074209 A1 | 3/2008 | Ceylan et al. | |
| 2008/0161073 A1* | 7/2008 | Park | H04B 1/1607 455/574 |
| 2008/0246550 A1 | 10/2008 | Biedka et al. | |
| 2009/0004981 A1 | 1/2009 | Eliezer et al. | |
| 2009/0061787 A1 | 3/2009 | Koller et al. | |
| 2009/0074106 A1 | 3/2009 | See et al. | |
| 2009/0125264 A1 | 5/2009 | Betts et al. | |
| 2009/0141830 A1 | 6/2009 | Ye | |
| 2009/0232260 A1 | 9/2009 | Hayashi et al. | |
| 2009/0302945 A1 | 12/2009 | Catoiu et al. | |
| 2010/0135439 A1 | 6/2010 | Lackey | |
| 2010/0298030 A1 | 11/2010 | Howard | |
| 2011/0095826 A1* | 4/2011 | Hadjichristos | H04B 1/0466 455/67.11 |
| 2011/0182347 A1 | 7/2011 | Cheung | |
| 2011/0227767 A1 | 9/2011 | O'Brien | |
| 2012/0068748 A1 | 3/2012 | Stojanovic et al. | |
| 2012/0139635 A1* | 6/2012 | Ho | H03F 1/0233 330/278 |
| 2012/0189081 A1 | 7/2012 | Omoto et al. | |
| 2012/0244824 A1 | 9/2012 | Entezari et al. | |
| 2012/0256688 A1 | 10/2012 | Onishi | |
| 2013/0141062 A1 | 6/2013 | Khlat | |
| 2013/0214858 A1 | 8/2013 | Tournatory et al. | |
| 2013/0222057 A1 | 8/2013 | Henshaw | |
| 2013/0243129 A1 | 9/2013 | Okuni et al. | |
| 2014/0028368 A1 | 1/2014 | Khlat | |
| 2014/0029683 A1 | 1/2014 | Morris et al. | |
| 2014/0055199 A1 | 2/2014 | Takano et al. | |
| 2014/0062590 A1 | 3/2014 | Khlat et al. | |
| 2014/0062599 A1 | 3/2014 | Xu et al. | |
| 2014/0065989 A1* | 3/2014 | McLaurin | H03F 3/189 455/114.3 |
| 2014/0072307 A1 | 3/2014 | Zamani et al. | |
| 2014/0084996 A1 | 3/2014 | Schwent et al. | |
| 2014/0105264 A1 | 4/2014 | McLaurin et al. | |
| 2014/0184337 A1 | 7/2014 | Nobbe et al. | |
| 2014/0213196 A1 | 7/2014 | Anger et al. | |
| 2014/0232470 A1* | 8/2014 | Wilson | H03F 1/00 330/297 |
| 2014/0266432 A1 | 9/2014 | Scott et al. | |
| 2014/0315504 A1 | 10/2014 | Sakai et al. | |
| 2014/0361837 A1 | 12/2014 | Strange et al. | |
| 2015/0028946 A1 | 1/2015 | Al-Qaq et al. | |
| 2015/0126142 A1 | 5/2015 | Meredith | |
| 2015/0333781 A1 | 11/2015 | Alon et al. | |
| 2016/0173030 A1 | 6/2016 | Langer et al. | |
| 2016/0174293 A1 | 6/2016 | Mow et al. | |
| 2016/0182099 A1 | 6/2016 | Boddupally et al. | |
| 2016/0182100 A1 | 6/2016 | Menkhoff et al. | |
| 2016/0301432 A1 | 10/2016 | Shizawa et al. | |
| 2016/0322992 A1 | 11/2016 | Okawa et al. | |
| 2017/0005676 A1 | 1/2017 | Yan et al. | |
| 2017/0104502 A1 | 4/2017 | Pratt | |
| 2017/0149457 A1 | 5/2017 | Mayer et al. | |
| 2017/0170838 A1 | 6/2017 | Pagnanelli | |
| 2017/0230924 A1 | 8/2017 | Wolberg et al. | |
| 2017/0338842 A1 | 11/2017 | Pratt | |
| 2017/0353197 A1 | 12/2017 | Ruffieux et al. | |
| 2018/0034418 A1 | 2/2018 | Blednov | |
| 2018/0175813 A1 | 6/2018 | Scott et al. | |
| 2018/0226923 A1 | 8/2018 | Nagamori | |
| 2018/0248570 A1 | 8/2018 | Camuffo | |
| 2019/0041890 A1 | 2/2019 | Chen et al. | |
| 2019/0058530 A1 | 2/2019 | Rainish et al. | |
| 2019/0068234 A1 | 2/2019 | Khlat et al. | |
| 2019/0097671 A1 | 3/2019 | Dimpflmaier et al. | |
| 2019/0238152 A1 | 8/2019 | Pagnanelli | |
| 2019/0245496 A1 | 8/2019 | Khlat et al. | |
| 2019/0296929 A1 | 9/2019 | Milicevic et al. | |

(56) References Cited

U.S. PATENT DOCUMENTS

| | | | |
|---|---|---|---|
| 2019/0319583 A1 | 10/2019 | El-Hassan et al. | |
| 2019/0356285 A1 | 11/2019 | Khlat et al. | |
| 2020/0106392 A1 | 4/2020 | Khlat et al. | |
| 2020/0119699 A1 | 4/2020 | Nishihara et al. | |
| 2020/0136563 A1* | 4/2020 | Khlat | H03F 1/0233 |
| 2020/0136568 A1 | 4/2020 | Hosoda et al. | |
| 2020/0162030 A1 | 5/2020 | Drogi et al. | |
| 2020/0204422 A1 | 6/2020 | Khlat | |
| 2020/0259685 A1 | 8/2020 | Khlat | |
| 2020/0295713 A1 | 9/2020 | Khlat | |
| 2020/0336111 A1 | 10/2020 | Khlat | |
| 2021/0058970 A1* | 2/2021 | Kwak | H04W 72/23 |
| 2021/0067097 A1 | 3/2021 | Wang et al. | |
| 2021/0099136 A1 | 4/2021 | Drogi et al. | |
| 2021/0143859 A1* | 5/2021 | Hageraats | H04B 7/0882 |
| 2021/0194517 A1 | 6/2021 | Mirea et al. | |
| 2021/0194740 A1* | 6/2021 | Aldana | H04W 16/14 |
| 2021/0281228 A1 | 9/2021 | Khlat | |
| 2021/0399690 A1 | 12/2021 | Panseri et al. | |
| 2022/0021348 A1 | 1/2022 | Philpott et al. | |
| 2022/0216834 A1 | 7/2022 | Myoung et al. | |
| 2022/0360229 A1 | 11/2022 | Khlat | |
| 2022/0407462 A1 | 12/2022 | Khlat | |
| 2022/0407463 A1 | 12/2022 | Khlat et al. | |
| 2022/0407464 A1 | 12/2022 | Khlat et al. | |
| 2022/0407465 A1 | 12/2022 | Khlat | |
| 2022/0407478 A1 | 12/2022 | Khlat et al. | |
| 2022/0416730 A1 | 12/2022 | Su et al. | |
| 2023/0065760 A1 | 3/2023 | Hellberg | |
| 2023/0079153 A1 | 3/2023 | Khlat | |
| 2023/0080621 A1 | 3/2023 | Khlat | |
| 2023/0080652 A1 | 3/2023 | Khlat et al. | |
| 2023/0081095 A1 | 3/2023 | Khlat | |
| 2023/0155614 A1 | 5/2023 | Jelonnek et al. | |
| 2023/0238927 A1 | 7/2023 | Kay et al. | |
| 2023/0387859 A1 | 11/2023 | Drogi et al. | |
| 2024/0372665 A1* | 11/2024 | Khoryaev | H04L 5/0053 |
| 2024/0426954 A1 | 12/2024 | Guan et al. | |

FOREIGN PATENT DOCUMENTS

| | | | |
|---|---|---|---|
| CN | 1326321 C | 12/2001 | |
| CN | 1550064 A | 11/2004 | |
| CN | 1706096 A | 12/2005 | |
| CN | 101036289 A | 9/2007 | |
| CN | 101651459 A | 2/2010 | |
| CN | 105812073 A | 7/2016 | |
| CN | 107483021 A | 12/2017 | |
| CN | 110798155 A | 2/2020 | |
| CN | 110855251 A | 2/2020 | |
| CN | 111064438 A | 4/2020 | |
| CN | 210693998 U | 6/2020 | |
| CN | 112995079 A | 6/2021 | |
| CN | 113055324 A | 6/2021 | |
| CN | 113659938 A | 11/2021 | |
| CN | 113055324 B | 12/2021 | |
| CN | 116015223 A | 4/2023 | |
| CN | 113659938 B | 5/2023 | |
| CN | 116794580 A | 9/2023 | |
| CN | 118117977 A | 5/2024 | |
| CN | 118117977 B | 11/2024 | |
| EP | 2705604 A2 | 3/2014 | |
| EP | 2582041 B1 | 4/2018 | |
| EP | 2232713 B1 | 10/2018 | |
| EP | 3416340 A1 | 12/2018 | |
| JP | 2011211533 A | 10/2011 | |
| JP | 2015099972 A | 5/2015 | |
| WO | 2007092794 A2 | 8/2007 | |
| WO | 2010011551 A2 | 1/2010 | |
| WO | 2010135711 A1 | 11/2010 | |
| WO | WO-2012151594 A2 * | 11/2012 | H02M 3/07 |
| WO | 2014026178 A1 | 2/2014 | |
| WO | 2021042088 A2 | 3/2021 | |
| WO | 2023150539 A1 | 8/2023 | |
| WO | 2023150545 A1 | 8/2023 | |
| WO | 2023150587 A1 | 8/2023 | |

OTHER PUBLICATIONS

Non-Final Office Action for U.S. Appl. No. 17/700,685, mailed Dec. 22, 2023, 24 pages.
Non-Final Office Action for U.S. Appl. No. 17/689,232, mailed Dec. 11, 2023, 27 pages.
Notice of Allowance and Examiner-Initiated Interview Summary for U.S. Appl. No. 17/737,300, mailed Dec. 19, 2023, 12 pages.
Notice of Allowance for U.S. Appl. No. 17/700,700, mailed Oct. 23, 2023, 9 pages.
Supplemental Notice of Allowability for U.S. Appl. No. 17/700,700, mailed Nov. 8, 2023, 5 pages.
Extended European Search Report for European Patent Application No. 23174010.1, mailed Oct. 10, 2023, 10 pages.
Corrected Notice of Allowability for U.S. Appl. No. 17/737,300, mailed Dec. 27, 2023, 8 pages.
U.S. Appl. No. 17/700,685, filed Mar. 22, 2022.
U.S. Appl. No. 17/689,232, filed Mar. 8, 2022.
U.S. Appl. No. 17/714,244, filed Apr. 6, 2022.
U.S. Appl. No. 17/737,300, filed May 5, 2022.
U.S. Appl. No. 17/942,472, filed Sep. 12, 2022.
U.S. Appl. No. 17/700,700, filed Mar. 22, 2022.
U.S. Appl. No. 17/939,350, filed Sep. 7, 2022.
U.S. Appl. No. 17/890,538, filed Aug. 18, 2022.
U.S. Appl. No. 17/700,826, filed Mar. 22, 2022.
International Search Report and Written Opinion for International Patent Application No. PCT/US2023/060303, mailed Apr. 11, 2023, 12 pages.
International Search Report and Written Opinion for International Patent Application No. PCT/US2022/043600, mailed Jan. 11, 2023, 15 pages.
Non-Final Office Action for U.S. Appl. No. 17/942,472, mailed Feb. 16, 2023, 13 pages.
Extended European Search Report for European Patent Application No. 22195382.1, mailed Feb. 1, 2023, 26 pages.
Extended European Search Report for European Patent Application No. 22195683.2, mailed Feb. 10, 2023, 12 pages.
Notice of Allowance for U.S. Appl. No. 17/700,685, mailed Apr. 5, 2024, 7 pages.
Final Office Action for U.S. Appl. No. 17/689,232, mailed Mar. 26, 2024, 28 pages.
Supplemental Notice of Allowability for U.S. Appl. No. 17/700,700, mailed Feb. 28, 2024, 5 pages.
Final Office Action for U.S. Appl. No. 17/942,472, mailed Jul. 19, 2023, 16 pages.
Advisory Action U.S. Appl. No. 17/689,232, mailed May 23, 2024, 3 pages.
Non-Final Office Action for U.S. Appl. No. 17/689,232, mailed Jul. 17, 2024, 22 pages.
Final Office Action for U.S. Appl. No. 17/939,350, mailed May 21, 2024, 11 pages.
Non-Final Office Action for U.S. Appl. No. 17/700,826, mailed May 15, 2024, 28 pages.
International Search Report and Written Opinion for International Patent Application No. PCT/US2023/061734, mailed May 30, 2023, 15 pages.
International Search Report and Written Opinion for International Patent Application No. PCT/US2023/061741, mailed Jun. 1, 2023, 14 pages.
Invitation to Pay Additional Fees and Partial International Search for International Patent Application No. PCT/US2023/061804, mailed May 26, 2023, 10 pages.
International Search Report and Written Opinion for International Patent Application No. PCT/US2023/061804, mailed Jul. 17, 2023, 20 pages.
Williams, P., "Crossover Filter Shape Comparisons," White Paper, Linea Research, Jul. 2013, 13 pages.

(56) References Cited

OTHER PUBLICATIONS

Corrected Notice of Allowability for U.S. Appl. No. 17/942,472, mailed Nov. 17, 2023, 6 pages.
Non-Final Office Action for U.S. Appl. No. 17/939,350, mailed Jan. 17, 2024, 11 pages.
Advisory Action for U.S. Appl. No. 17/942,472, mailed Sep. 15, 2023, 3 pages.
Notice of Allowance for U.S. Appl. No. 17/942,472, mailed Oct. 18, 2023, 10 pages.
International Search Report and Written Opinion for International Patent Application No. PCT/US2023/019267, mailed Aug. 3, 2023, 14 pages.
Cho, M., "Analog Predistortion for Improvement of RF Power Amplifier Efficiency and Linearity," A Dissertation presented to the Academic Faculty in partial fulfillment of the requirements for the degree Doctor of Philosophy in the School of Electrical and Computer Engineering, Georgia Institute of Technology, Aug. 2016, available from the Internet: [URL: https://repository.gatech.edu/server/api/core/bitstreams/b8fe5cbb-e5db-4efe-b9a2-eaad5f671f14/content], 113 pages.
Kwak, T.-W et al., "A 2W CMOS Hybrid Switching Amplitude Modulator for EDGE Polar Transmitters," IEEE Journal of Solid-State Circuits, vol. 42, No. 12, Dec. 2007, IEEE, pp. 2666-2676.
Paek, J.-S et al., "A -137 dBm/Hz Noise, 82% Efficiency AC-Coupled Hybrid Supply Modulator With Integrated Buck-Boost Converter," IEEE Journal of Solid-State Circuits, vol. 51, No. 11, Nov. 2016, IEEE pp. 2757-2768.
Non-Final Office Action for U.S. Appl. No. 17/737,300, mailed Aug. 28, 2023, 14 pages.
Extended European Search Report for European Patent Application No. 23153108.8, mailed Jun. 20, 2023, 18 pages.
Non-Final Office Action for U.S. Appl. No. 17/700,700, mailed Apr. 13, 2023, 11 pages.
Bai, W.-D et al., "Principle of Vector Synthesis Predistortion Linearizers Controlling AM/AM and AM/PM Independently," 2016 IEEE International Conference on Ubiquitous Wireless Broadband (ICUWB), Oct. 16-19, 2016, Nanjing, China, IEEE, 3 pages.
Extended European Search Report for European Patent Application No. 22195695.6, mailed Feb. 14, 2023, 12 pages.
Extended European Search Report for European Patent Application No. 22196188.1, mailed Feb. 2, 2023, 25 pages.
Hammi et al., "Temperature Compensated Digital Predistorter for 3G Power Amplifiers," Electronics, Circuit and Systems, 2005, Dec. 11, 2005, pp. 1-4.
Hao et al., "Hybrid Analog/Digital Linearization Based on Dual-Domain Decomposition of Nonlinearity," 2019 IEEE Asia-Pacific Microwave Conference, Dec. 10, 2019, pp. 156-158.
Lee et al., "Fully Automated Adaptive Analog Predistortion Power Amplifier in WCDMA Applications," 2005 European Microwave Conference CNIT La Defense, Paris, France, vol. 2, Oct. 4, 2005, pp. 967-970.
Li et al., "Analog Predistorter Averaged Digital Predistortion for Power Amplifiers in Hybrid Beam-Forming Multi-Input Multi-Output Transmitter," IEEE Access, vol. 8, Aug. 1, 2020, pp. 146145-146153.
Tome et al., "Hybrid Analog/Digital Linearizatio nof GaN HEMT-Based Power Amplifiers," IEEE Transactions on Microwave Theory and Techniques, vol. 67, No. 1, Jan. 1, 2019, pp. 288-294.
Notice of Allowance for U.S. Appl. No. 17/689,232, mailed Oct. 21, 2024, 10 pages.
Notice of Allowance for U.S. Appl. No. 17/714,244, mailed Sep. 16, 2024, 8 pages.
Non-Final Office Action for U.S. Appl. No. 17/939,350, mailed Sep. 6, 2024, 8 pages.
Non-Final Office Action for U.S. Appl. No. 17/890,538, mailed Oct. 21, 2024, 13 pages.
Notice of Allowance and Examiner-Initiated Interview Summary for U.S. Appl. No. 17/700,826, mailed Sep. 11, 2024, 10 pages.
International Search Report and Written Opinion for International Patent Application No. PCT/US2023/060803, mailed May 19, 2023, 13 pages.
International Search Report and Written Opinion for International Patent Application No. PCT/US2023/060804, mailed May 4, 2023, 19 pages.
International Search Report and Written Opinion for International Patent Application No. PCT/US2023/025512, mailed Sep. 28, 2023, 13 pages.
Fu, J.-S et al., "Improving Power Amplifier Efficiency and Linearity Using a Dynamically Controlled Tunable Matching Network," IEEE Transactions on Microwave Theory and Techniques, vol. 56, No. 12, Dec. 2008, pp. 3239-3244.
Kim, S. et al., "A Tunable Power Amplifier Employing Digitally Controlled Accumulation-mode Varactor Array for 2.4-GHz Short-range Wireless Communication," 2016 IEEE Asia Pacific Conference on Circuits and Systems (APCCAS), Oct. 25-28, 2016, Jeju, Korea (South), IEEE, pp. 269-272.
Wang, T.-P., "A Fully Integrated W-Band Push-Push CMOS VCO With Low Phase Noise and Wide Tuning Range," IEEE Transactions on Ultrasonics, Ferroelectrics, and Frequency Control, vol. 58, No. 7, Jul. 2011, IEEE, pp. 1307-1319.
Wanner, R. et al., "Monolithically Integrated SiGe Push-Push Oscillators in the Frequency Range 50-190 GHz," 2006 IEEE Ninth International Symposium on Spread Spectrum Techniques and Applications, Aug. 28-31, 2006, Manaus, Brazil, IEEE, pp. 26-30.

\* cited by examiner

PHASE AND AMPLITUDE ERROR CORRECTION IN A TRANSMISSION CIRCUIT

RELATED APPLICATIONS

This application claims the benefit of provisional patent application Ser. No. 63/245,160, filed Sep. 16, 2021, and provisional patent application Ser. No. 63/245,151, filed Sep. 16, 2021, the disclosures of which are hereby incorporated herein by reference in their entireties.

FIELD OF THE DISCLOSURE

The technology of the disclosure relates generally to correcting amplitude-amplitude (AM-AM) and amplitude-phase (AM-PM) errors in a transmission circuit.

BACKGROUND

Mobile communication devices have become increasingly common in current society for providing wireless communication services. The prevalence of these mobile communication devices is driven in part by the many functions that are now enabled on such devices. Increased processing capability in such devices means that mobile communication devices have evolved from being pure communication tools into sophisticated mobile multimedia centers that enable enhanced user experiences.

The redefined user experience relies on a higher data rate offered by advanced fifth generation (5G) and 5G new radio (5G-NR) technologies, which typically transmit and receive radio frequency (RF) signals in millimeter wave spectrums. Given that the RF signals are more susceptible to attenuation and interference in the millimeter wave spectrums, the RF signals are typically amplified by state-of-the-art power amplifiers to help boost the RF signals to higher power before transmission.

In a typical transmission circuit, a transceiver circuit is configured to generate an RF signal, a power management circuit is configured to generate a modulated voltage, a power amplifier circuit is configured to amplify the RF signal based on the modulated voltage, and an antenna circuit is configured to transmit the RF signal in one or more transmission frequencies. The power amplifier circuit can be further coupled to the antenna circuit via an RF front-end circuit (e.g., filter, switches, etc.). Notably, an output reflection coefficient (e.g., $S_{22}$) of the power amplifier circuit can interact with an input reflection coefficient (e.g., $S_{11}$) of the RF front-end circuit to cause a group delay in the RF signal to potentially create an amplitude-to-amplitude (AM-AM) error in the modulated voltage and/or an amplitude-to-phase (AM-PM) error in the RF signal. As such, it is desirable to correct the AM-AM and AM-PM errors in all of the transmission frequencies to help prevent undesired amplitude distortion and/or spectrum regrowth, particularly when the RF signal is modulated across a wide modulation bandwidth (e.g., ≥200 MHz).

SUMMARY

Embodiments of the disclosure relate to phase and amplitude error correction in a transmission circuit. The transmission circuit includes a transceiver circuit, a power management integrated circuit (PMIC), and a power amplifier circuit(s). The transceiver circuit generates a radio frequency (RF) signal(s) from an input vector, the PMIC generates a modulated voltage, and the power amplifier circuit(s) amplifies the RF signal(s) based on the modulated voltage. When the power amplifier circuit(s) is coupled to an RF front-end circuit (e.g., filter/multiplexer), an output reflection coefficient (e.g., $S_{22}$) of the power amplifier circuit(s) can interact with an input reflection coefficient (e.g., $S_{11}$) of the RF front-end circuit to create unwanted amplitude-amplitude (AM-AM) and amplitude-phase (AM-PM) errors across a modulation bandwidth of the transmission circuit. In this regard, in embodiments disclosed herein, the input vector is equalized based on multiple complex filters to thereby cause the AM-AM and AM-PM errors to be corrected in the transmission circuit. As a result, it is possible to reduce undesired instantaneous excessive compression and/or spectrum regrowth across the modulation bandwidth of the transmission circuit.

In one aspect, a transmission circuit is provided. The transmission circuit includes a PMIC. The PMIC includes a phase correction circuit. The phase correction circuit is configured to receive a modulated target voltage and an indication of a selected target frequency among multiple target frequencies. The phase correction circuit is also configured to determine a reference phase correction voltage corresponding to a reference frequency based on the modulated target voltage. The phase correction circuit is also configured to determine a scaling factor corresponding to the selected target frequency. The phase correction circuit is also configured to generate the phase correction voltage based on the determined reference phase correction voltage and the determined scaling factor. The PMIC also includes a power amplifier circuit. The power amplifier circuit includes a phase shifter. The phase shifter is configured to determine a phase shift based on the phase correction voltage. The phase shifter is also configured to apply the phase shift to an RF signal modulated for transmission in the selected target frequency to thereby generate a phase-shifted RF signal.

In another aspect, a method for correcting phase and amplitude errors in a transmission circuit is provided. The method includes receiving a modulated target voltage and an indication of a selected target frequency among multiple target frequencies. The method also includes determining a reference phase correction voltage corresponding to a reference frequency based on the modulated target voltage. The method also includes determining a scaling factor corresponding to the selected target frequency. The method also includes generating a phase correction voltage based on the determined reference phase correction voltage and the determined scaling factor. The method also includes determining a phase shift based on the phase correction voltage. The method also includes applying the phase shift to an RF signal modulated for transmission in the selected target frequency to thereby generate a phase-shifted RF signal.

In another aspect, a PMIC is provided. The PMIC includes a phase correction circuit. The phase correction circuit is configured to receive a modulated target voltage and an indication of a selected target frequency among multiple target frequencies. The phase correction circuit is also configured to determine a reference phase correction voltage corresponding to a reference frequency based on the modulated target voltage. The phase correction circuit is also configured to determine a scaling factor corresponding to the selected target frequency. The phase correction circuit is also configured to generate a phase correction voltage based on the determined reference phase correction voltage and the determined scaling factor. The PMIC also includes a voltage modulation circuit. The voltage modulation circuit is configured to generate a modulated voltage based on the modulated target voltage.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1A:
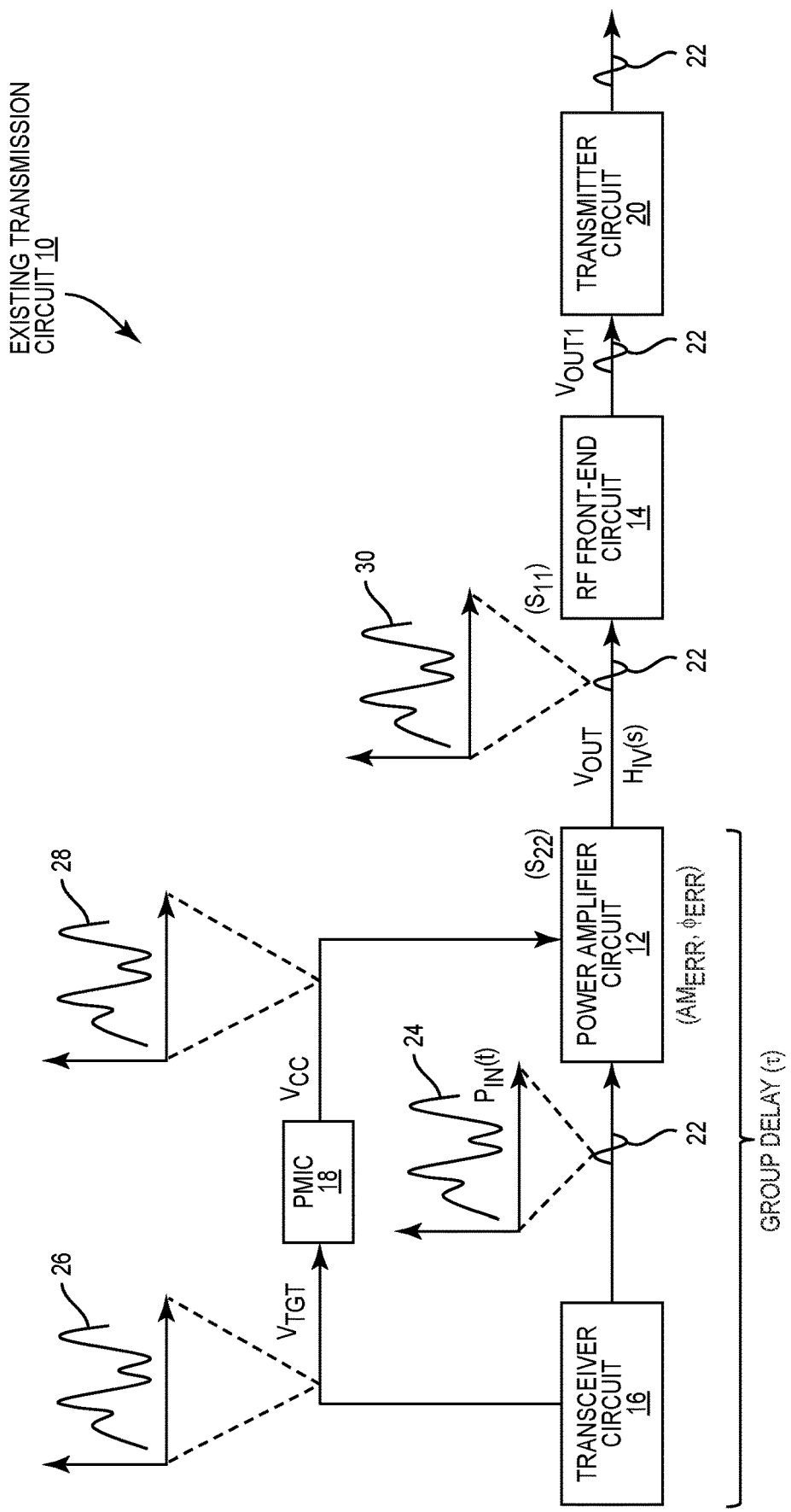
FIG. 1A is a schematic diagram of an exemplary existing transmission circuit, wherein unwanted amplitude-amplitude (AM-AM) and amplitude-phase (AM-PM) errors may be created when a power amplifier circuit is coupled to a radio frequency (RF) front-end circuit.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to phase and amplitude error correction in a transmission circuit. The transmission circuit includes a transceiver circuit, a power management integrated circuit (PMIC), and a power amplifier circuit(s). The transceiver circuit generates a radio frequency (RF) signal(s) from an input vector, the PMIC generates a modulated voltage, and the power amplifier circuit(s) amplifies the RF signal(s) based on the modulated voltage. When the power amplifier circuit(s) is coupled to an RF front-end circuit (e.g., filter/multiplexer), an output reflection coefficient (e.g., $S_{22}$) of the power amplifier circuit(s) can interact with an input reflection coefficient (e.g., $S_{11}$) of the RF front-end circuit to create unwanted amplitude-amplitude (AM-AM) and amplitude-phase (AM-PM) errors across a modulation bandwidth of the transmission circuit. In this regard, in embodiments disclosed herein, the input vector is equalized based on multiple complex filters to thereby cause the AM-AM and AM-PM errors to be corrected in the transmission circuit. As a result, it is possible to reduce undesired instantaneous excessive compression and/or spectrum regrowth across the modulation bandwidth of the transmission circuit.

Figure 2:
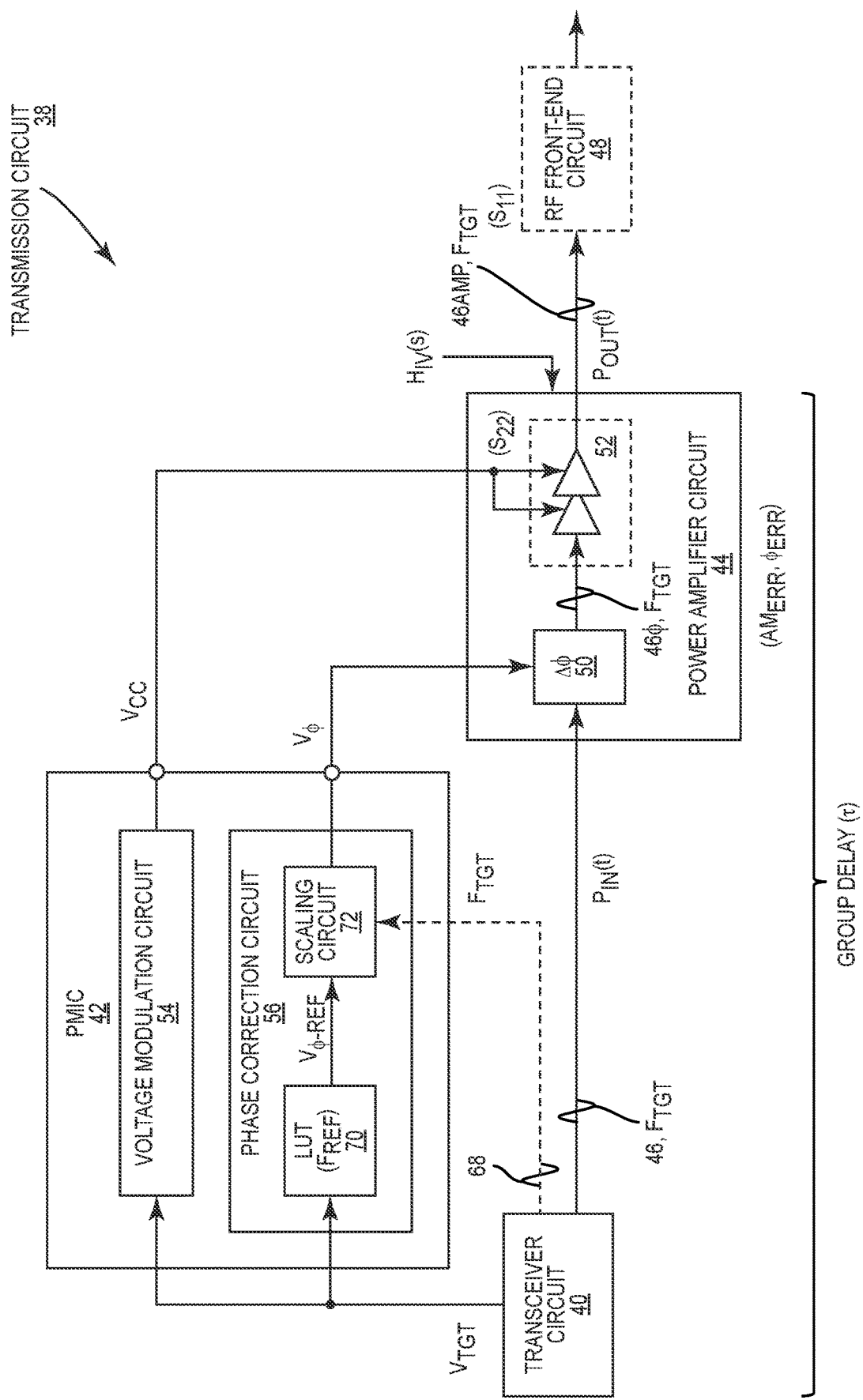
FIG. 2 is a schematic diagram of an exemplary transmission circuit that can be configured according to embodiments of the present disclosure to correct the AM-AM and the AM-PM errors across a modulation bandwidth that includes multiple transmission frequencies.

Before discussing the transmission circuit according to the present disclosure, starting at FIG. 2, a brief discussion of an existing transmission circuit is first provided to help understand how unwanted AM-AM and AM-PM errors may be created when a power amplifier circuit is coupled to an RF front-end circuit, such as a filter/multiplexer circuit.

FIG. 1A is a schematic diagram of an exemplary existing transmission circuit 10, wherein an unwanted voltage distortion filter $H_{IV}(s)$ may be created on a power amplifier circuit 12 when the power amplifier circuit 12 is coupled to an RF front-end circuit 14. Notably, in the unwanted voltage distortion filter $H_{IV}(s)$, "s" is a notation of Laplace transform. The existing transmission circuit 10 includes a transceiver circuit 16, a power management integrated circuit (PMIC) 18, and a transmitter circuit 20, which can include an antenna(s) (not shown) as an example.

The transceiver circuit 16 is configured to generate an RF signal 22 having a time-variant input power $P_{IN}(t)$ that corresponds to a time-variant voltage envelope 24 and provides the RF signal 22 to the power amplifier circuit 12. The transceiver circuit 16 is also configured to generate a time-variant target voltage $V_{TGT}$, which is associated with a time-variant target voltage envelope 26 that tracks the time-variant voltage envelope 24 of the RF signal 22. The PMIC 18 is configured to generate a modulated voltage $V_{CC}$ having a time-variant modulated voltage envelope 28 that tracks the time-variant target voltage envelope 26 of the time-variant target voltage $V_{TGT}$ and provides the modulated voltage $V_{CC}$ to the power amplifier circuit 12. The power amplifier circuit 12 is configured to amplify the RF signal 22 based on the modulated voltage $V_{CC}$ to a time-variant output voltage $V_{OUT}$ associated with a time-variant output voltage envelope 30. The power amplifier circuit 12 then provides the amplified RF signal 22 to the RF front-end circuit 14. The RF front-end circuit 14 may include, for example, a filter circuit that performs further frequency filtering on the amplified RF signal 22 before providing the amplified RF signal 22 to the transmitter circuit 20 for transmission.

Figure 1B:
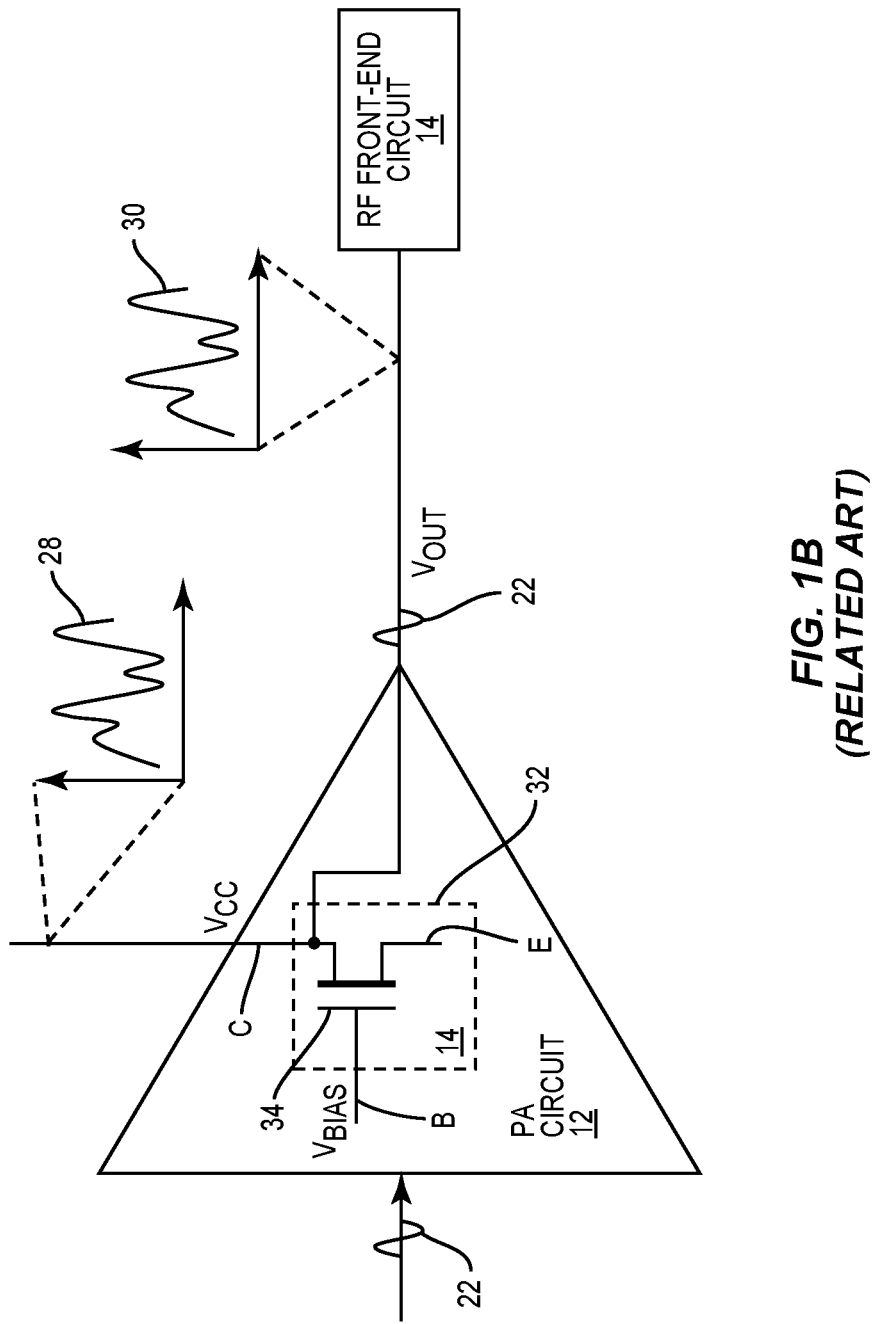
FIG. 1B is a schematic diagram providing an exemplary illustration of an output stage of the power amplifier circuit in FIG. 1A.

FIG. 1B is a schematic diagram providing an exemplary illustration of an output stage 32 of the power amplifier circuit 12 in FIG. 1A. Common elements between FIGS. 1A and 1B are shown therein with common element numbers and will not be re-described herein.

The output stage 32 can include at least one transistor 34, such as a bipolar junction transistor (BJT) or a complementary metal-oxide semiconductor (CMOS) transistor. Taking the BJT as an example, the transistor 34 can include a base electrode B, a collector electrode C, and an emitter electrode E. The base electrode B is configured to receive a bias voltage $V_{BIAS}$ and the collector electrode C is configured to receive the modulated voltage $V_{CC}$. The collector electrode C is also coupled to the RF front-end circuit 14 and configured to output the amplified RF signal 22 at the output voltage $V_{OUT}$. In this regard, the output voltage $V_{OUT}$ can be a function of the modulated voltage $V_{CC}$. Understandably, the power amplifier circuit 12 will operate with good efficiency and linearity when the time-variant modulated voltage envelope 28 is aligned with the time-variant output voltage envelope 30.

Figure 1C:
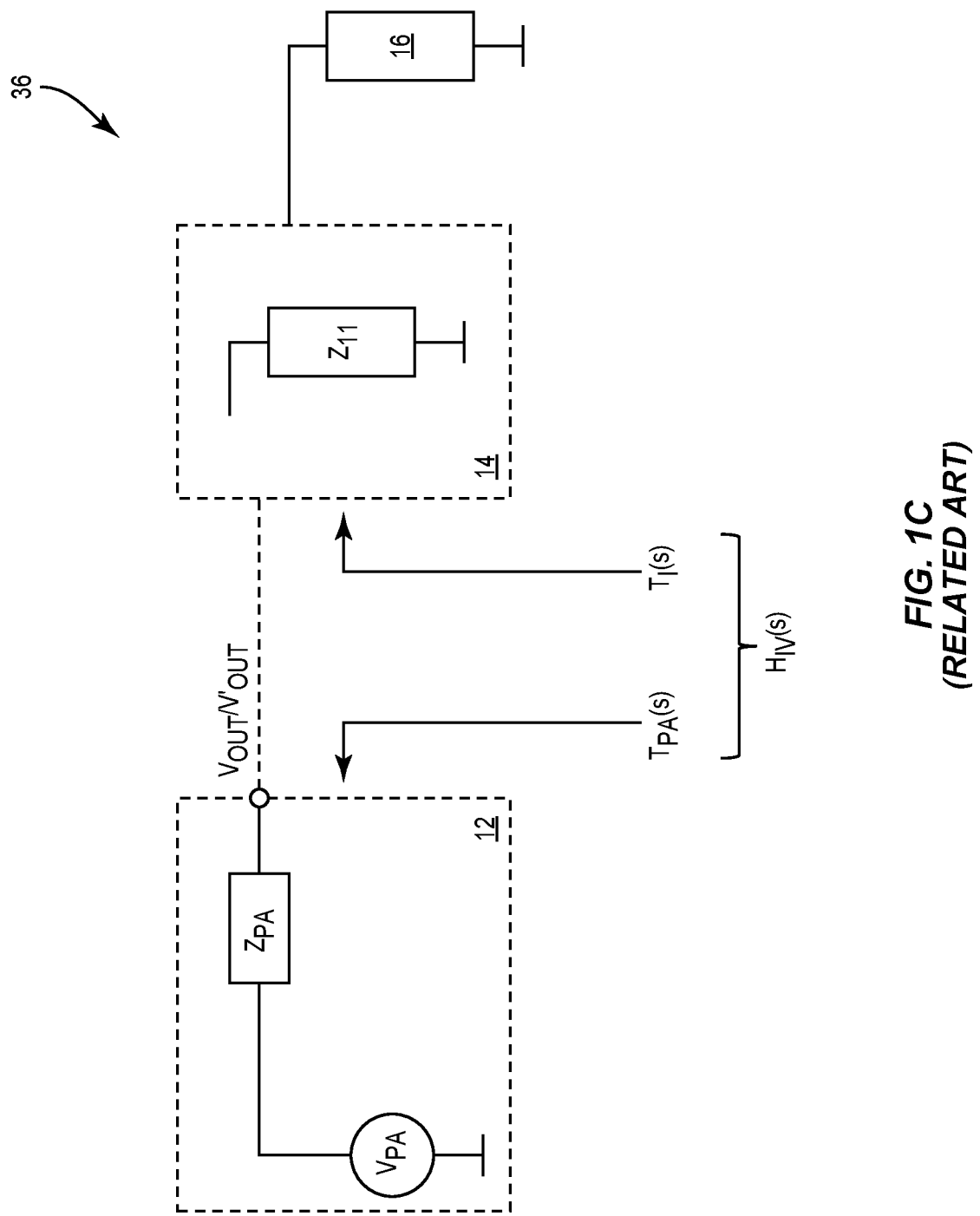
FIG. 1C is a schematic diagram of an exemplary equivalent model providing an exemplary illustration of the unwanted voltage distortion filter created by a coupling between the power amplifier circuit and the RF front-end circuit 14 in FIG. 1A.

FIG. 1C is a schematic diagram of an exemplary equivalent model 36 providing an exemplary illustration of the voltage distortion filter $H_{IV}(s)$ created by the coupling between the power amplifier circuit 12 and the RF front-end circuit 14 in the existing transmission circuit 10 of FIG. 1A. Common elements between FIGS. 1A-1C are shown therein with common element numbers and will not be re-described herein In the equivalent model 36, $V_{PA}$ and $Z_{PA}$ represent the output stage 32 of the power amplifier circuit 12 and an inherent impedance of the power amplifier circuit 12, respectively, and $Z_{11}$ represents an inherent impedance associated with an input port of the RF front-end circuit 14. Herein, $V_{OUT}$ represents an output voltage associated with the RF signal 22 before the power amplifier circuit 12 is coupled to the RF front-end circuit 14, and $V'_{OUT}$ represents an output voltage associated with the RF signal 22 after the power amplifier circuit 12 is coupled to the RF front-end circuit 14. Hereinafter, the output voltages $V_{OUT}$ and $V'_{OUT}$ are referred to as "non-coupled output voltage" and "coupled output voltage," respectively, for distinction.

A Laplace transform representative of the coupled output voltage $V'_{OUT}$ can be expressed in equation (Eq. 1) below.

$$V'_{OUT}(s) = \frac{V_{OUT}(s)^*[1 - T_{PA}(s)]^*[1 + T_I(s)]}{2^*[1 - T_{PA}(s)^*T_I(s)]} = V_{OUT}(s)^* H_{IV}(s) \quad \text{(Eq. 1)}$$

$$H_{IV}(s) = \frac{[1 - T_{PA}(s)]^*[1 + T_I(s)]}{2^*[1 - T_{PA}(s)^*T_I(s)]}$$

In the equation (Eq. 1) above, $T_{PA}(s)$ represents a reflection coefficient looking back into the output stage 32 of the power amplifier circuit 12 and $T_I(s)$ represents a reflection coefficient looking into the RF front-end circuit 14. Notably, $T_{PA}(s)$ and $T_I(s)$ are complex filters containing amplitude and phase information. In this regard, the $T_{PA}(s)$, the $T_I(s)$, and, therefore, the voltage distortion filter $H_{IV}(s)$ are dependents of such factors as modulation bandwidth, RF frequency, and/or voltage standing wave ratio (VSWR).

The equation (Eq. 1) shows that the coupled output voltage $V'_{OUT}$ will be altered from the non-coupled output voltage $V_{OUT}$ by the voltage distortion filter $H_{IV}(s)$ when the power amplifier circuit 12 is coupled to the RF front-end circuit 14. Moreover, the variation of the non-coupled output voltage $V_{OUT}$ caused by the voltage distortion filter $H_{IV}(s)$ can happen across all frequencies in an entire modulation bandwidth of the RF signal 22. As a result, the coupled output voltage $V'_{OUT}$ may become misaligned from the modulated voltage $V_{CC}$ across the modulation bandwidth of the RF signal 22, thus causing a frequency dependent AM-AM error $AM_{ERR}$ across the modulation bandwidth of the existing transmission circuit 10.

With reference back to FIG. 1A, when the power amplifier circuit 12 is coupled to the RF front-end circuit 14, an output reflection coefficient (e.g., $S_{22}$) of the power amplifier circuit 12 can interact with an input reflection coefficient (e.g., $S_{11}$)

of the RF front-end circuit 14 to create a group delay τ in the RF signal 22. The group delay τ, which can be expressed in equation (Eq. 2) below, can cause a phase error Δϕ at the power amplifier circuit 12 to thereby create an AM-PM error ϕ$_{ERR}$ in the RF signal 22.

$$\tau = -\Delta\phi/\Delta t \tag{Eq. 2}$$

Figure 1D:
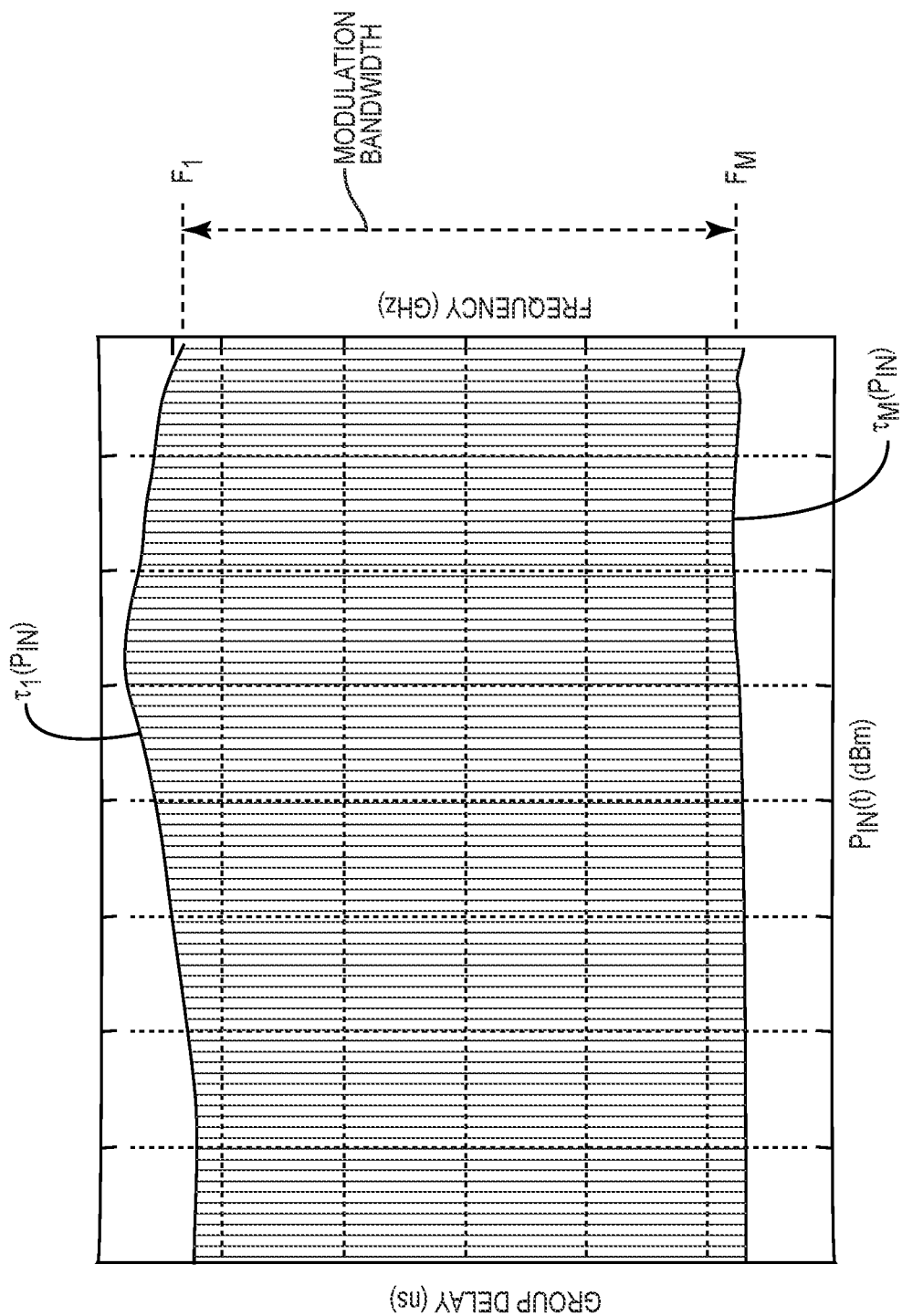
FIG. 1D is a graphic diagram illustrating a distribution of multiple group delays across multiple transmission frequencies.

Studies have shown that the group delay τ in each of the transmission frequencies varies in accordance with the time-variant input power P$_{IN}$(t), as illustrated in FIG. 1D. FIG. 1D is a graphic diagram illustrating a distribution of the group delay τ across multiple transmission frequencies F$_1$-F$_M$ within a modulation bandwidth of the RF signal 22 in FIG. 1A. As shown in FIG. 1D, each of the transmission frequencies F$_1$-F$_M$ is associated with a respective one of multiple variable group delays τ$_1$(P$_{IN}$)-τ$_M$(P$_{IN}$), and each of the variable group delays τ$_1$(P$_{IN}$)-τ$_M$(P$_{IN}$) varies independently in accordance with the time-variant input power P$_{IN}$(t).

Figure 1E:
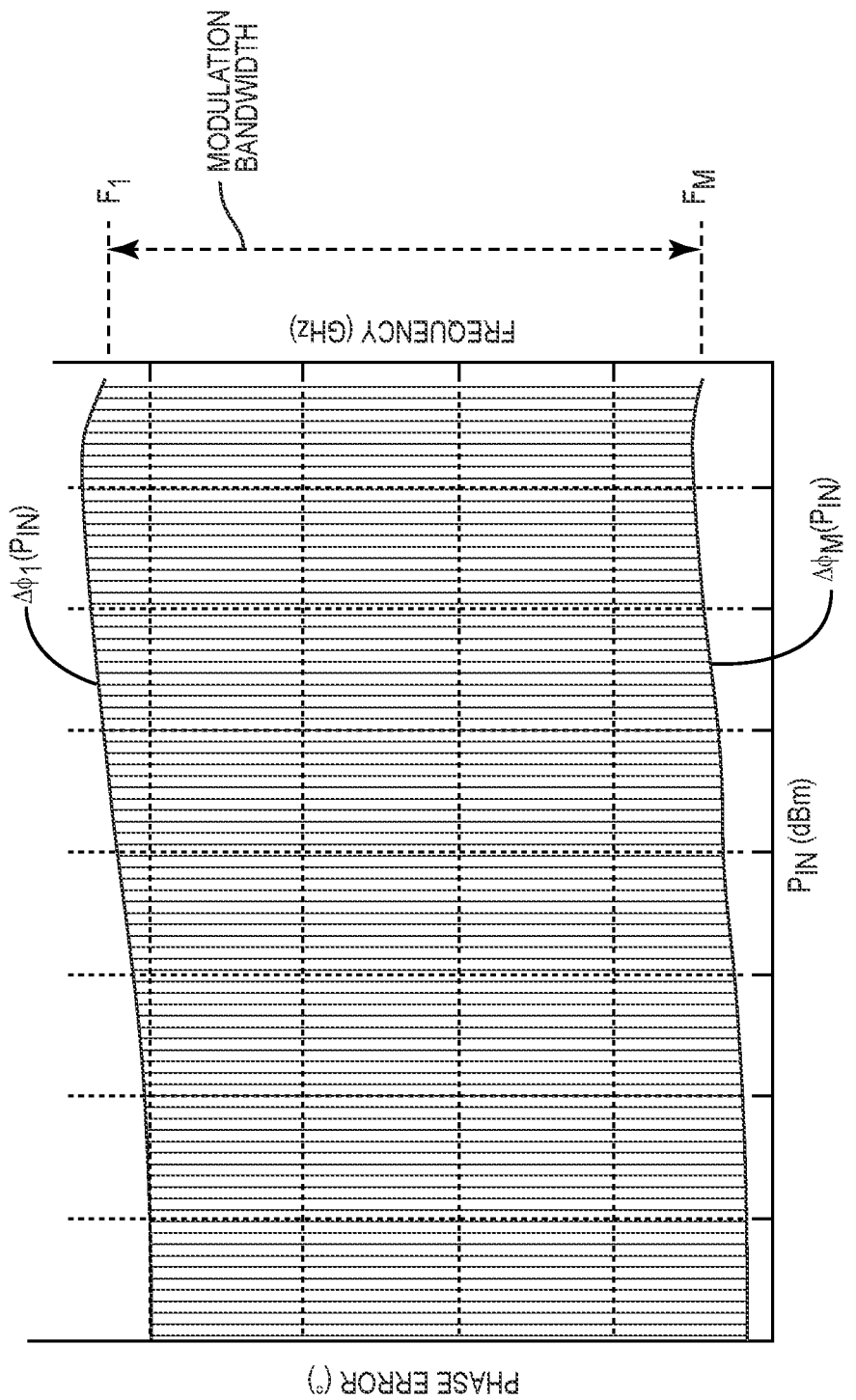
FIG. 1E is a graphic diagram illustrating a distribution of multiple variable phase errors across multiple transmission frequencies.

Given the relationship between the group delay τ and the phase error Δϕ in equation (Eq. 2), the phase error Δϕ associated with each of the variable group delays τ$_1$(P$_{IN}$)-τ$_M$(P$_{IN}$) will also vary according to the time-variant input power P$_{IN}$(t). FIG. 1E is a graphic diagram illustrating a distribution of the variable phase errors Δϕ$_1$(P$_{IN}$)-Δϕ$_M$(P$_{IN}$) across the transmission frequencies F$_1$-F$_M$ of the RF signal 22 in FIG. 1A. As shown in FIG. 1E, each of the transmission frequencies F$_1$-F$_M$ is associated with a respective one of multiple variable phase errors Δϕ$_1$(P$_{IN}$)-Δϕ$_M$(P$_{IN}$). Moreover, for any given level of the time-variant input power P$_{IN}$(t), each of the variable phase errors Δϕ$_1$(P$_{IN}$)-Δϕ$_M$(P$_{IN}$) associated with a respective one of the transmission frequencies F$_1$-F$_M$ is nonlinear relative to any other variable phase errors Δϕ$_1$(P$_{IN}$)-Δϕ$_M$(P$_{IN}$) associated with any other transmission frequencies F$_1$-F$_M$. For example, the variable phase errors Δϕ$_1$(P$_{IN}$) associated with the transmission frequency F$_1$ is nonlinearly related to the variable phase errors Δϕ$_M$(P$_{IN}$) associated with the transmission frequency F$_M$ for any given value of the time-variant input power P$_{IN}$(t).

Figure 1F:
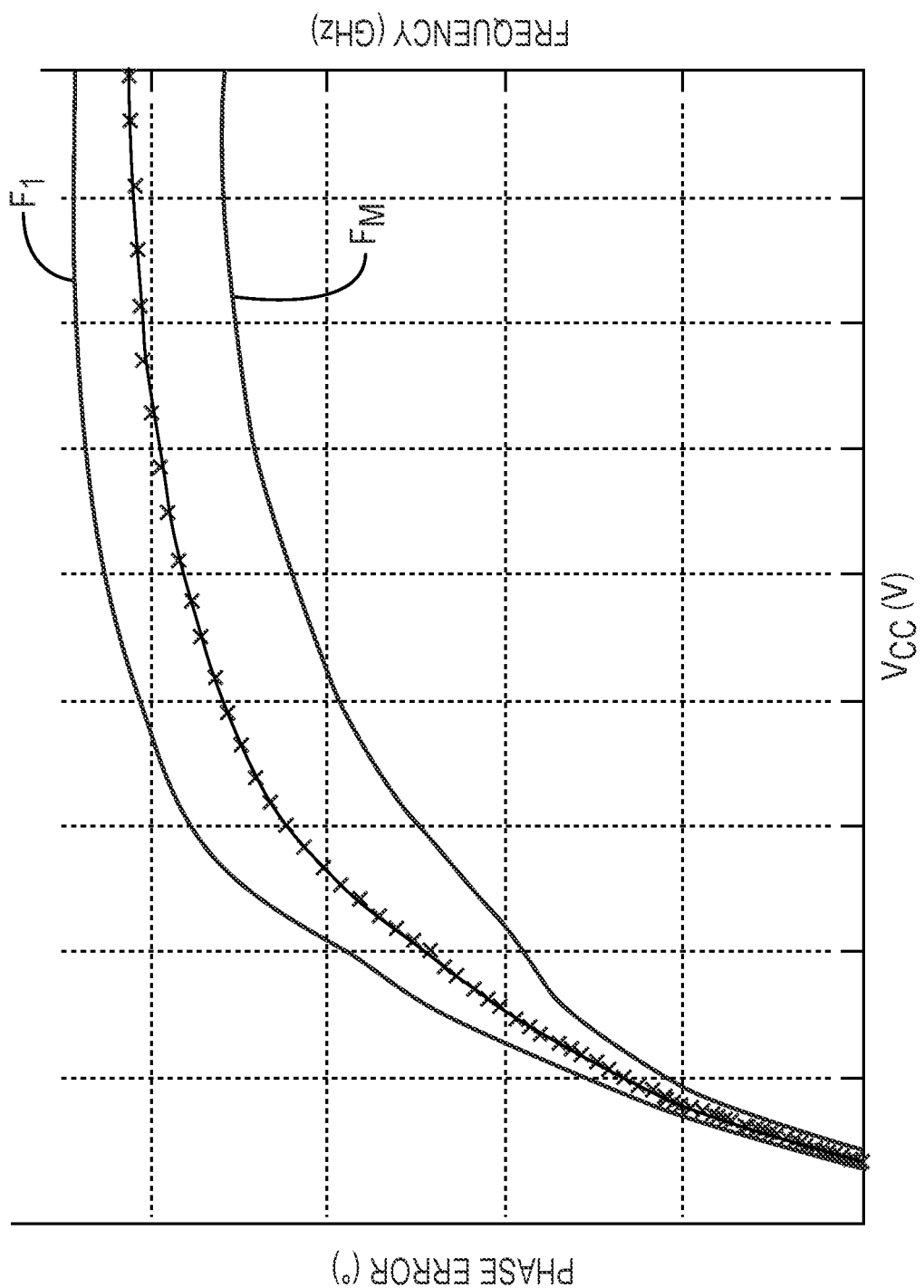
FIG. 1F is a graphic diagram illustrating a distribution of the AM-AM and AM-PM errors across multiple transmission frequencies.

Similar to the frequency dependent amplitude error AM$_{ERR}$, the AM-PM error ϕ$_{ERR}$ resulted from the variable phase errors Δϕ$_1$(P$_{IN}$)-Δϕ$_M$(P$_{IN}$) are also frequency dependent. FIG. 1F is a graphic diagram illustrating a distribution of the AM-AM and AM-PM errors across the transmission frequencies F$_1$-F$_M$ of the RF signal 22 in FIG. 1A.

As shown in FIG. 1F, the AM-PM error ϕ$_{ERR}$ varies according to the modulated voltage V$_{CC}$ in each of the transmission frequencies F$_1$-F$_M$. In this regard, it is necessary to correct both the AM-AM and the AM-PM errors in the existing transmission circuit 10 to ensure proper alignment between the time-variant voltage envelope 24, the time-variant modulated voltage envelope 28, and the time-variant output voltage envelope 30.

In this regard, FIG. 2 is a schematic diagram of an exemplary transmission circuit 38 that can be configured according to embodiments of the present disclosure to correct the AM-AM AM$_{ERR}$ and the AM-PM error ϕ$_{ERR}$ in the existing transmission circuit 10 of FIG. 1A across a modulation bandwidth that includes multiple transmission frequencies (a.k.a. target frequencies) F$_1$-F$_M$. Herein, the transmission circuit 38 includes a transceiver circuit 40, a PMIC 42, and a power amplifier circuit 44.

The transceiver circuit 40 is configured to generate an RF signal 46 in a time-variant input power P$_{IN}$(t) and for transmission in a selected transmission frequency (a.k.a. selected target frequency) F$_{TGT}$ among the transmission frequencies F$_1$-F$_M$. The power amplifier circuit 44 is configured to amplify the RF signal 46 from the time-variant input power P$_{IN}$(t) to a time-variant output power P$_{OUT}$(t) based on a modulated voltage V$_{CC}$ to thereby generate an amplified RF signal 46 AMP. The PMIC 42 is configured to generate the modulated voltage V$_{CC}$, which can be an envelope tracking (ET) modulated voltage or an average power tracking (APT) modulated voltage, based on a modulated target voltage V$_{TGT}$. The transceiver circuit 40 is also configured to generate the modulated target voltage V$_{TGT}$ that tracks the time-variant input power P$_{IN}$(t) and provides the modulated target voltage V$_{TGT}$ to the PMIC 42. Ideally, since the modulated target voltage V$_{TGT}$ tracks the time-variant input power P$_{IN}$(t) and the modulated voltage V$_{CC}$ tracks the modulated target voltage V$_{TGT}$, the modulated voltage V$_{CC}$ should be in good alignment with the time-variant input power P$_{IN}$(t). In this regard, if the power amplifier circuit 44 can operate with a linear gain, the time-variant output power P$_{OUT}$(t) should also be linearly related to the time-variant input power P$_{IN}$(t) by the linear gain of the power amplifier circuit 44.

Like the power amplifier circuit 12 in FIG. 1A, the power amplifier circuit 44 can also include the output stage 32 (as shown in FIG. 1B) and be coupled to an RF front-end circuit 48 (e.g., a filter, multiplexer, and/or switches).

As such, the transmission circuit 38 may also suffer the frequency dependent AM-AM error AM$_{ERR}$ and the frequency dependent AM-PM error ϕ$_{ERR}$ as in the existing transmission circuit 10 of FIG. 1A. In other words, in the transmission circuit 38, the output reflection coefficient (e.g., S$_{22}$) of the power amplifier circuit 44 can interact with the input reflection coefficient (e.g., S$_{11}$) of the RF front-end circuit 48 to create the voltage distortion filter H$_{IV}$(s) and, consequently, cause the AM-AM error AM$_{ERR}$ and the AM-PM error ϕ$_{ERR}$.

As described in detail below, the transmission circuit 38 can be configured according to various embodiments of the present disclosure to effectively correct the AM-AM error AM$_{ERR}$ and the AM-PM error ϕ$_{ERR}$. More specifically, the transmission circuit 38 can concurrently correct the AM-AM and AM-PM errors via multiple complex filters. As a result, the transmission circuit 38 can reduce undesired instantaneous excessive compression and/or spectrum regrowth to thereby improve efficiency and linearity of the power amplifier circuit 44 across an entire modulation bandwidth of the transmission circuit 38.

In an embodiment, the power amplifier circuit 44 includes a phase shifter 50 and a power amplifier 52. The phase shifter 50 is configured to apply a phase shift Δϕ to the RF signal 46 to correct the AM-PM error ϕ$_{ERR}$. More specifically, the phase shifter 50 is configured to receive a modulated phase correction voltage V$_ϕ$ from the PMIC 42 and determine the phase shift Δϕ based on the modulated phase correction voltage V$_ϕ$. In a non-limiting example, the phase shifter 50 may include internal storage (not shown), such as registers for example, to store a correlation between various levels of the modulated phase correction voltage V$_ϕ$ and various degrees of phase shift Δϕ. For example, the phase shifter 50 can store a correlation between the modulated phase correction voltage V$_ϕ$ of 0 V, 1 V, and 2 V and the phase shift Δϕ of 0°, 1°, and 2°, respectively. Accordingly, the phase shifter 50 can determine the correct phase shift Δϕ based on the modulated phase correction voltage V$_ϕ$ and apply the determined phase shift Δϕ to the RF signal 46 to generate a phase-shifted RF signal 46ϕ. Understandably, since the phase shifter 50 only applies the phase shift Δϕ to the RF signal 46, the phase-shifted RF signal 46ϕ will have the same time-variant input power P$_{IN}$(t) and in the same selected target frequency F$_{TGT}$.

Subsequently, the power amplifier 52 can amplify the phase-shifted RF signal 46ϕ based on a modulate voltage, such as an envelope tracking (ET) voltage or an average power tracking (APT) voltage, to generate the amplified RF signal 46AMP. Understandably, since the power amplifier 52 only changes the time-variant input power $P_{IN}(t)$ in the phase-shifted RF signal 46ϕ to the time-variant output power $P_{OUT}(t)$ in the amplified RF signal 46AMP, the amplified RF signal 46AMP will maintain the same phase as in the phase-shifted RF signal 46ϕ. Thus, by generating the modulated phase correction voltage $V_\phi$ at a proper voltage level, it is possible to correct the AM-PM error $\phi_{ERR}$ in the amplified RF signal 46AMP.

The PMIC 42 includes a voltage modulation circuit 54 and a phase correction circuit 56. According to an embodiment of the present disclosure, the voltage modulation circuit 54 is configured to generate the modulated voltage $V_{CC}$ based on the modulated target voltage $V_{TGT}$ and provide the modulated voltage $V_{CC}$ to the power amplifier 52. The phase correction circuit 56 is configured to generate the phase correction voltage $V_\phi$ based on the modulated target voltage $V_{TGT}$ and provide the phase correction voltage $V_\phi$ to the phase shifter 50.

Figure 3:
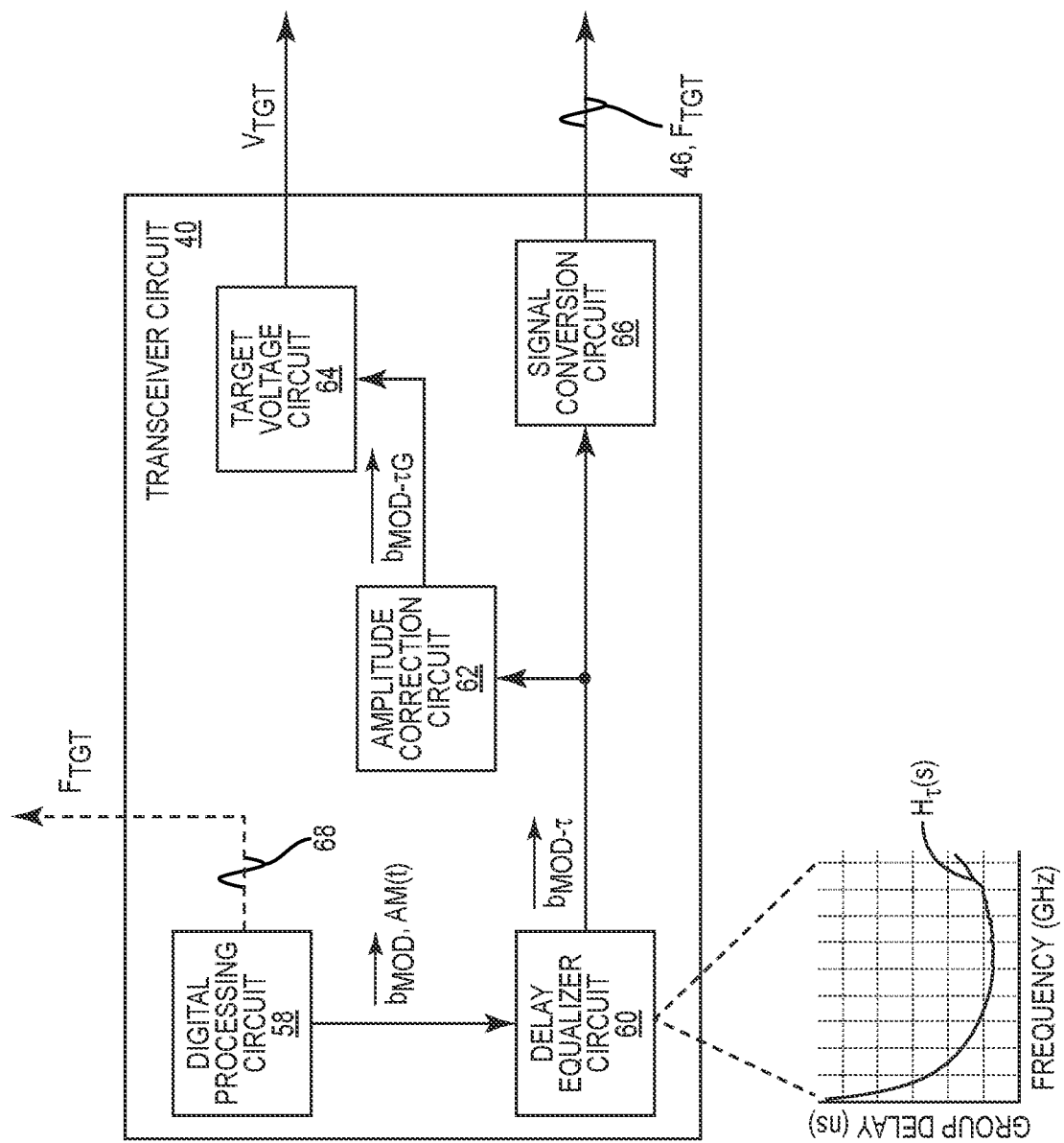
FIG. 3 is a schematic diagram illustrating a transceiver circuit in the transmission circuit of FIG. 2 configured according to an embodiment of the present disclosure.

In an embodiment, the transceiver circuit 40 is configured to generate the modulated voltage $V_{TGT}$ and provide the modulated target voltage $V_{TGT}$ to the voltage modulation circuit 54 and the phase correction circuit 56. In this regard, FIG. 3 is a schematic diagram illustrating the transceiver circuit 40 configured according to an embodiment of the present disclosure. Common elements between FIGS. 2 and 3 are shown therein with common element numbers and will not be re-described herein.

Herein, the transceiver circuit 40 includes a digital processing circuit 58, a delay equalizer circuit 60, an amplitude correction circuit 62, a target voltage circuit 64, and a signal conversion circuit 66. The digital processing circuit 58, which can be a digital baseband circuit as an example, is configured to generate an input vector $\overrightarrow{b_{MOD}}$ corresponding to a time-variant amplitude AM(t). The input vector $\overrightarrow{b_{MOD}}$ may be modulated in a baseband frequency that can be converted to any of the transmission frequencies $F_1$-$F_M$ within the modulation bandwidth of the transmission circuit 38.

According to the previous discussion in FIG. 1D, the input vector $\overrightarrow{b_{MOD}}$ can be associated with multiple variable group delays $\tau_1(P_{IN})$-$\tau_M(P_{IN})$, each corresponding to a respective one of the transmission frequencies $F_1$-$F_M$. In other words, the variable group delays $\tau_1(P_{IN})$-$\tau_M(P_{IN})$ can be different from one another between the transmission frequencies $F_1$-$F_M$.

Figure 4A:
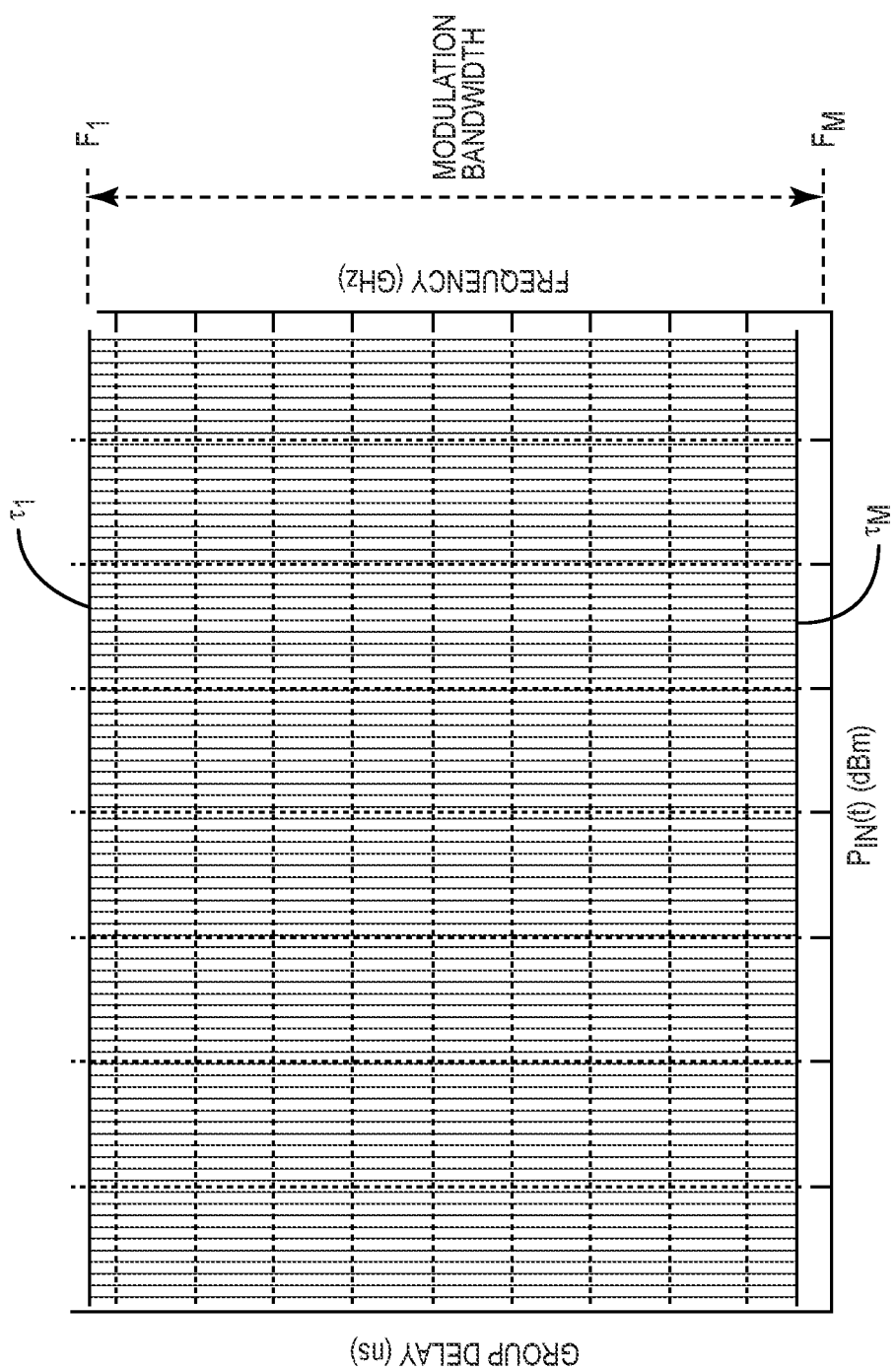
FIG. 4A is a graphic diagram illustrating a distribution of multiple constant group delays across multiple transmission frequencies.

The delay equalizer circuit 60 is configured to apply a delay equalization filter $H_\tau(s)$ to the input vector $\overrightarrow{b_{MOD}}$ to convert each of the variable group delays $\tau_1(P_{IN})$-$\tau_M(P_{IN})$ into a respective one of multiple constant group delays $\tau_1$-$\tau_M$, as illustrated in FIG. 4A. FIG. 4A is a graphic diagram illustrating a distribution of the constant group delays $\tau_1$-$\tau_M$ across the transmission frequencies $F_1$-$F_M$ as a result of applying the delay equalization filter $H_\tau(s)$ to the input vector $\overrightarrow{b_{MOD}}$. As shown in FIG. 4A, for each of the transmission frequencies $F_1$-$F_M$, the respective one of the group delays $\tau_1$-$\tau_M$ stays constant relative to the time-variant input power $P_{IN}(t)$.

Figure 4B:
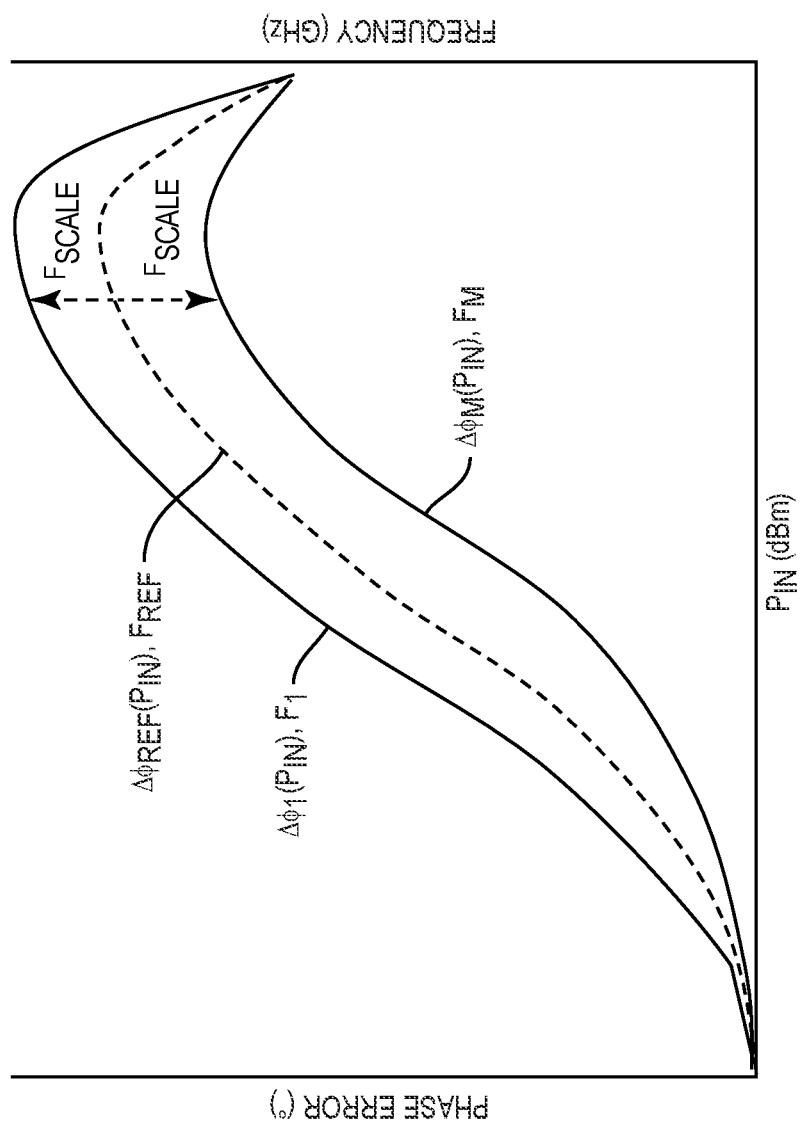
FIG. 4B is a graphic diagram illustrating a distribution of multiple linearly related variable phase errors across the multiple transmission frequencies in FIG. 4A.

Given the constant group delays $\tau_1$-$\tau_M$ and the $\tau$-$\Delta\phi$ relationship established in equation (Eq. 2), the variable phase errors $\Delta\phi_1(P_{IN})$-$\Delta\phi_M(P_{IN})$ will in turn exhibit a linear relationship across the transmission frequencies $F_1$-$F_M$, as illustrated in FIG. 4B.

FIG. 4B is a graphic diagram illustrating a distribution of the variable phase errors $\Delta\phi_1(P_{IN})$-$\Delta\phi_M(P_{IN})$ across the transmission frequencies $F_1$-$F_M$ as a result of applying the delay equalization filter $H_\tau(s)$ to the input vector $\overrightarrow{b_{MOD}}$. Given the linear relationship between the variable phase errors $\Delta\phi_1(P_{IN})$-$\Delta\phi_M(P_{IN})$, each of the variable phase errors $\Delta\phi_1(P_{IN})$-$\Delta\phi_M(P_{IN})$ can be moved up or down based on an appropriate scaling factor $F_{SCALE}$ to superimpose on another one of the variable phase errors $\Delta\phi_1(P_{IN})$-$\Delta\phi_M(P_{IN})$. For example, the variable phase errors $\Delta\phi_1(P_{IN})$ associated with the transmission frequency $F_1$ can be moved downward to superimpose on the variable phase errors $\Delta\phi_M(P_{IN})$ associated with the transmission frequency $F_M$. Likewise, the variable phase errors $\Delta\phi_M(P_{IN})$ associated with the transmission frequency $F_M$ can be moved upward to superimpose on the variable phase errors $\Delta\phi_1(P_{IN})$ associated with the transmission frequency $F_1$.

With reference back to FIG. 3, by applying the delay equalization filter $H_\tau(s)$ to the input vector $\overrightarrow{b_{MOD}}$, the delay equalizer circuit 60 generates a delay-equalized vector $\overrightarrow{b_{MOD-\tau}}$. Specifically, the delay-equalized vector $\overrightarrow{b_{MOD-\tau}}$ can be associated with a respective one of the constant group delays $\tau_1$-$\tau_M$ corresponding to the selected target frequency $F_{TGT}$. The signal conversion circuit 66, which may include, for example, a digital-to-analog converter (DAC) and a frequency converter, can then convert the delay-equalized vector $\overrightarrow{b_{MOD-\tau}}$ in the RF signal 46 in the selected target frequency $F_{TGT}$. In an embodiment, the digital processing circuit 58 may be configured to generate an indication 68 that indicates the selected target frequency $F_{TGT}$ and provide the indication 68 to the phase correction circuit 56.

To correct the AM-AM error $AM_{ERR}$, the amplitude correction circuit 62 is configured to equalize the delay-equalized vector $\overrightarrow{b_{MOD-\tau}}$ to thereby generate a delay-gain-equalized vector $\overrightarrow{b_{MOD-\tau G}}$ having a constant gain in the selected target frequency $F_{TGT}$. The target voltage circuit 64, in turn, generates the modulated target voltage $V_{TGT}$ from the delay-gain-equalized vector $\overrightarrow{b_{MOD-\tau G}}$ and provides the modulated target voltage $V_{TGT}$ to the PMIC 42. For an in-depth description of the amplitude correction circuit 62, please refer to U.S. patent application Ser. No. 17/700,826, entitled "ENVELOPE TRACKING VOLTAGE CORRECTION IN A TRANSMISSION CIRCUIT."

With reference back to FIG. 2, to correct the AM-PM error $\phi_{ERR}$, the phase correction circuit 56 is configured to explore the linearity and scalability characteristics of variable phase errors $\Delta\phi_1(P_{IN})$-$\Delta\phi_M(P_{IN})$ across the transmission frequencies $F_1$-$F_M$, as illustrated in FIG. 4B, to thereby determine the modulated phase correction voltage $V_\phi$. In an embodiment, the phase correction circuit 56 includes a phase correction voltage lookup table (LUT) circuit 70 and a scaling circuit 72. The phase correction voltage LUT circuit 70 may include a phase correction voltage LUT (not shown) that correlates the modulated target voltage $V_{TGT}$ with various levels of a reference phase correction voltage $V_{\phi-REF}$ predefined for a reference frequency $F_{REF}$. In a non-limiting example, the reference frequency $F_{REF}$ can be any of the target frequencies $F_1$-$F_M$, a center frequency of the modulation bandwidth of the transmission circuit 38, or even an arbitrary frequency. Moreover, the reference frequency $F_{REF}$ may be identical to or different from the selected target frequency $F_{TGT}$. In this regard, the phase correction voltage LUT circuit 70 can look up the phase correction LUT to select the reference phase correction voltage $V_{\phi-REF}$ based on the modulated target voltage $V_{TGT}$.

Figure 5:
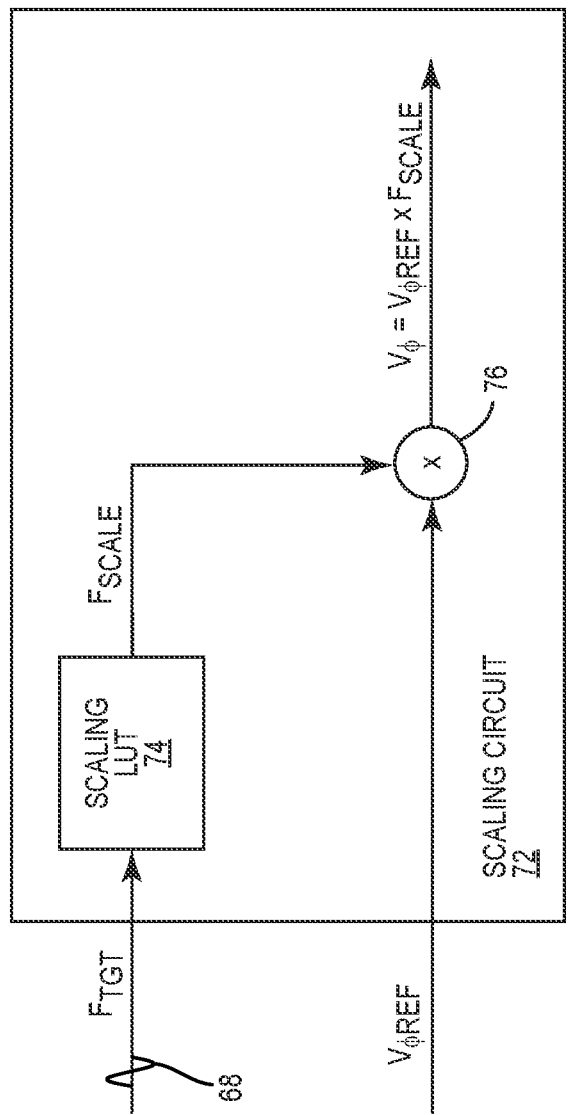
FIG. 5 is a schematic diagram illustrating a scaling circuit in the transmission circuit of FIG. 2 configured according to an embodiment of the present disclosure.

FIG. 5 is a schematic diagram illustrating the scaling circuit 72 in the phase correction circuit 56 in FIG. 2.

Common elements between FIGS. 2 and 5 are shown therein with common element numbers and will not be re-described herein.

In an embodiment, the scaling circuit 72 includes a scaling LUT circuit 74 and a multiplier 76. The scaling LUT circuit 74 is configured to determine the scaling factor $F_{SCALE}$ corresponding to the selected target frequency $F_{TGT}$ based on, for example, a scaling LUT (not shown) stored in the scaling LUT circuit 74. The multiplier 76 is configured to multiply the reference phase correction voltage $V_{\phi-REF}$ by the scaling factor $F_{SCALE}$ to thereby generate the phase correction voltage $V_\phi$ ($V_\phi = V_{\phi-REF} \times F_{SCALE}$).

Figure 6:
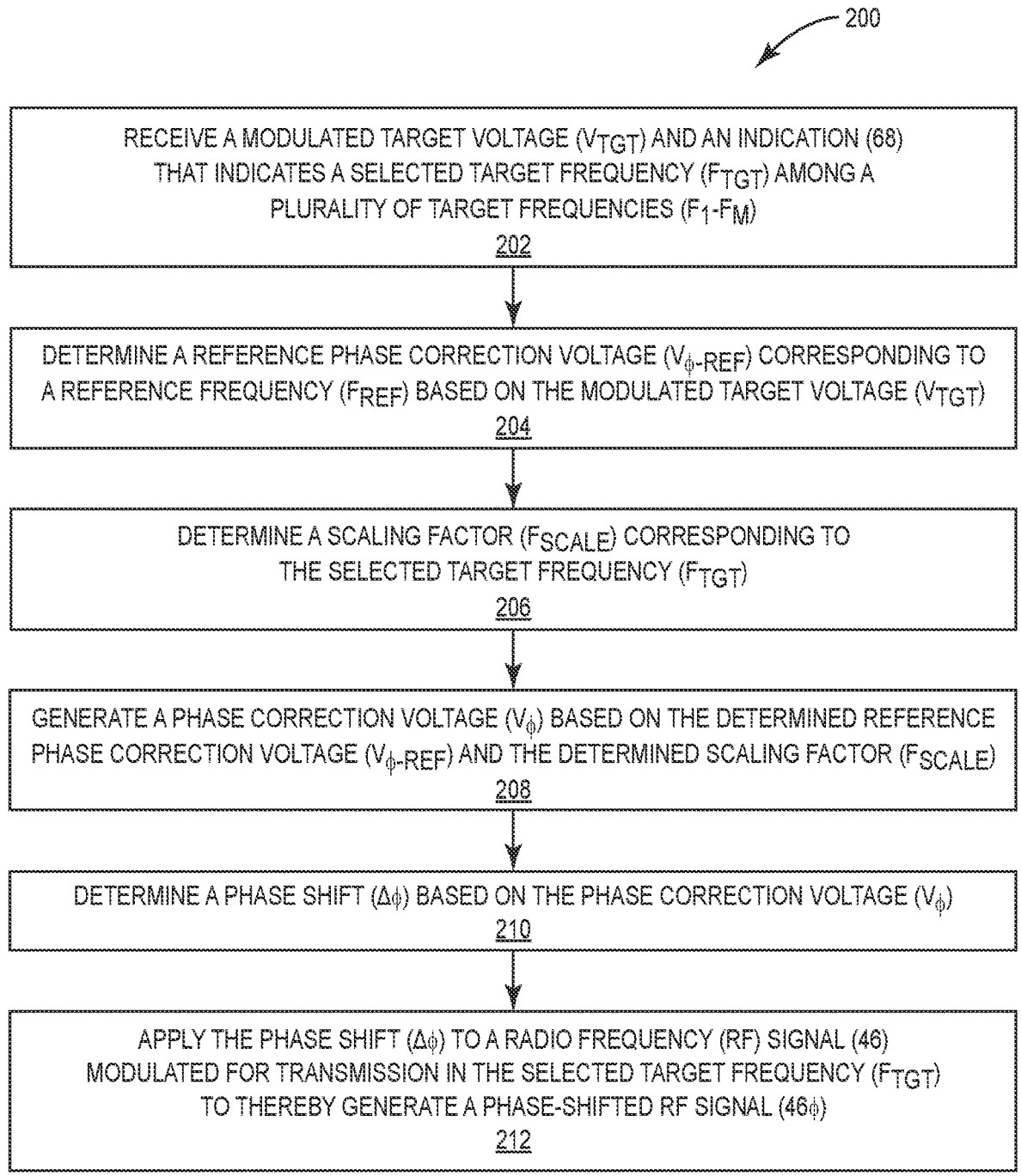
FIG. 6 is a flowchart of an exemplary process that can be performed by the transmission circuit of FIG. 2 to correct the AM-AM and AM-PM errors in the transmission circuit.

The transmission circuit 38 of FIG. 2 can be configured to correct the AM-AM error $AM_{ERR}$ and the AM-PM error $\phi_{ERR}$ based on a process. In this regard, FIG. 6 is a flowchart of an exemplary process 200 that can be employed by the transmission circuit of FIG. 2 to correct the AM-AM error $AM_{ERR}$ and the AM-PM error $\phi_{ERR}$.

Herein, the phase correction circuit 56 receives the modulated target voltage $V_{TGT}$ and the indication 68 that indicates the selected target frequency $F_{TGT}$ among the target frequencies $F_1$-$F_M$ (step 202). Accordingly, the phase correction circuit 56 determines the reference phase correction voltage $V_{\phi-REF}$ corresponding to a reference frequency $F_{REF}$ based on the modulated target voltage $V_{TGT}$ (step 204). Next, the phase correction circuit 56 determines the scaling factor $F_{SCALE}$ corresponding to the selected target frequency $F_{TGT}$ (step 206). Subsequently, the phase correction circuit 56 generates the phase correction voltage $V_\phi$ based on the determined reference phase correction voltage $V_{\phi-REF}$ and the determined scaling factor $F_{SCALE}$ (step 208). The phase shifter 50 determines the phase shift $\Delta\phi$ based on the phase correction voltage $V_\phi$ (step 210). Accordingly, the phase shifter applies the phase shift $\Delta\phi$ to the RF signal 46, which is modulated for transmission in the selected target frequency $F_{TGT}$, to thereby generate a phase-shifted RF signal 46$\phi$ (step 212).

Those skilled in the art will recognize improvements and modifications to the preferred embodiments of the present disclosure. All such improvements and modifications are considered within the scope of the concepts disclosed herein and the claims that follow.

What is claimed is:

1. A transmission circuit comprising:
a power management integrated circuit (PMIC) comprising a phase correction circuit configured to:
receive a modulated target voltage tracking a time-variant input power of a radio frequency (RF) signal and an indication of a selected target frequency among a plurality of target frequencies for transmission of the RF signal;
determine a reference phase correction voltage predefined for a reference frequency based on the modulated target voltage;
determine a scaling factor corresponding to the selected target frequency; and
scale the determined reference phase correction voltage by the determined scaling factor to thereby generate a phase correction voltage; and
a power amplifier circuit comprising a phase shifter configured to:
determine a phase shift corresponding to the phase correction voltage; and
apply the phase shift to the RF signal to thereby generate a phase-shifted RF signal.

2. The transmission circuit of claim 1, wherein:
the power amplifier circuit further comprises a power amplifier configured to amplify the phase-shifted RF signal based on a modulated voltage for transmission in the respective one of the plurality of target frequencies; and
the PMIC further comprises a voltage modulation circuit configured to generate the modulated voltage based on the modulated target voltage.

3. The transmission circuit of claim 1, wherein the phase correction circuit comprises:
a phase correction voltage lookup table (LUT) circuit configured to determine the reference phase correction voltage predefined for the reference frequency based on the modulated target voltage; and
a scaling circuit configured to:
determine the scaling factor corresponding to the selected target frequency; and
multiply the reference phase correction voltage by the scaling factor to thereby generate the phase correction voltage.

4. The transmission circuit of claim 3, wherein the scaling circuit comprises:
a scaling LUT circuit configured to determine the scaling factor corresponding to the selected target frequency; and
a multiplier configured to multiply the reference phase correction voltage by the scaling factor to generate the phase correction voltage.

5. The transmission circuit of claim 1, wherein the reference frequency is identical to the selected target frequency among the plurality of target frequencies.

6. The transmission circuit of claim 1, wherein the reference frequency is any one of the plurality of target frequencies.

7. The transmission circuit of claim 1, further comprising a transceiver circuit configured to:
generate the RF signal based on an input vector and having the time-variant input power corresponding to a time-variant amplitude of the input vector; and
generate the modulated target voltage based on the time-variant amplitude of the input vector.

8. The transmission circuit of claim 7, wherein the transceiver circuit comprises:
a digital processing circuit configured to generate the input vector associated with a plurality of time-variant group delays each corresponding to a respective one of the plurality of target frequencies; and
a delay equalizer circuit configured to:
equalize the input vector based on a delay equalization filter to thereby convert the plurality of time-variant group delays into a plurality of constant group delays each corresponding to the respective one of the plurality of target frequencies; and
generate a delay-equalized vector associated with a respective one of the plurality of constant group delays corresponding to the selected target frequency among the plurality of target frequencies; and
a signal conversion circuit configured to generate the RF signal for transmission in the selected target frequency based on the delay-equalized vector.

9. The transmission circuit of claim 8, wherein the digital processing circuit is further configured to generate the indication of the selected target frequency among the plurality of target frequencies.

10. The transmission circuit of claim 8, wherein the transceiver circuit further comprises:
an amplitude correction circuit configured to equalize the delay-equalized vector to thereby generate a delay-gain-equalized vector having a constant gain in the selected target frequency; and
a target voltage circuit configured to generate the modulated target voltage based on the delay-gain-equalized vector.

11. A method for correcting phase and amplitude errors in a transmission circuit comprising:
receiving a modulated target voltage tracking a time-variant input power of a radio frequency (RF) signal and an indication of a selected target frequency among a plurality of target frequencies for transmission of the RF signal;
determining a reference phase correction voltage predefined for a reference frequency based on the modulated target voltage;
determining a scaling factor corresponding to the selected target frequency;
scaling the determined reference phase correction voltage by the determined scaling factor to thereby generate a phase correction voltage;
determining a phase shift corresponding to the phase correction voltage; and
applying the phase shift to the RF signal to thereby generate a phase-shifted RF signal.

12. The method of claim 11, further comprising:
amplifying the phase-shifted RF signal based on a modulated voltage for transmission in the respective one of the plurality of target frequencies; and
generating the modulated voltage based on the modulated target voltage.

13. The method of claim 11, further comprising:
determining, from a phase correction voltage lookup table (LUT), the reference phase correction voltage predefined for the reference frequency based on the modulated target voltage; and
multiplying the reference phase correction voltage by the scaling factor to thereby generate the phase correction voltage.

14. The method of claim 11, further comprising selecting the reference frequency to be:
identical to the selected target frequency among the plurality of target frequencies.

15. The method of claim 11, further comprising selecting the reference frequency to be any one of the plurality of target frequencies.

16. The method of claim 11, further comprising:
generating the RF signal based on an input vector and having the time-variant input power corresponding to a time-variant amplitude of the input vector; and
generating the modulated target voltage based on the time-variant amplitude of the input vector.

17. The method of claim 16, further comprising:
generating the input vector associated with a plurality of time-variant group delays each corresponding to a respective one of the plurality of target frequencies;
equalizing the input vector based on a delay equalization filter to thereby convert the plurality of time-variant group delays into a plurality of constant group delays each corresponding to the respective one of the plurality of target frequencies;
generating a delay-equalized vector associated with a respective one of the plurality of constant group delays corresponding to the selected target frequency among the plurality of target frequencies; and
generating the RF signal for transmission in the selected target frequency based on the delay-equalized vector.

18. The method of claim 17, further comprising:
equalizing the delay-equalized vector to thereby generate a delay-gain-equalized vector having a constant gain in the selected target frequency; and
generating the modulated target voltage based on the delay-gain-equalized vector.

19. The transmission circuit of claim 1, wherein the reference frequency is a center frequency of a modulation bandwidth of the transmission circuit.

20. A wireless device comprising a transmission circuit, the transmission circuit comprises:
a power management integrated circuit (PMIC) comprising a phase correction circuit configured to:
receive a modulated target voltage tracking a time-variant input power of a radio frequency (RF) signal and an indication of a selected target frequency among a plurality of target frequencies for transmission of the RF signal;
determine a reference phase correction voltage predefined for a reference frequency based on the modulated target voltage;
determine a scaling factor corresponding to the selected target frequency; and
scale the determined reference phase correction voltage by the determined scaling factor to thereby generate a phase correction voltage; and
a power amplifier circuit comprising a phase shifter configured to:
determine a phase shift corresponding to the phase correction voltage;
apply the phase shift to the RF signal to thereby generate a phase-shifted RF signal; and
amplify the phase-shifted RF signal based on a modulated voltage for transmission in the selected target frequency.

* * * * *